(12) United States Patent
Arendt et al.

(10) Patent No.: US 11,935,740 B2
(45) Date of Patent: Mar. 19, 2024

(54) DUAL GATE DIELECTRIC LAYERS GROWN WITH AN INHIBITOR LAYER

(71) Applicant: Texas Instruments Incorporated, Dallas, TX (US)

(72) Inventors: Mark Francis Arendt, Richardson, TX (US); Damien Thomas Gilmore, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/730,944

(22) Filed: Apr. 27, 2022

(65) Prior Publication Data
US 2022/0254627 A1 Aug. 11, 2022

Related U.S. Application Data

(62) Division of application No. 16/836,755, filed on Mar. 31, 2020, now Pat. No. 11,348,782.

(51) Int. Cl.
*H01L 21/02* (2006.01)
*H01L 21/8234* (2006.01)
*H01L 29/51* (2006.01)

(52) U.S. Cl.
CPC .. *H01L 21/02164* (2013.01); *H01L 21/02271* (2013.01); *H01L 21/823462* (2013.01); *H01L 29/51* (2013.01)

(58) Field of Classification Search
None
See application file for complete search history.

(56) References Cited

U.S. PATENT DOCUMENTS

| | | | |
|---|---|---|---|
| 6,033,958 A * | 3/2000 | Chou | H01L 21/823462 438/275 |
| 6,080,682 A | 6/2000 | Ibok | |
| 6,261,972 B1 | 7/2001 | Tews et al. | |
| 6,387,827 B1 | 5/2002 | Mertens et al. | |
| 6,436,771 B1 | 8/2002 | Jang et al. | |
| 6,511,887 B1 | 1/2003 | Yu et al. | |
| 6,524,910 B1 | 2/2003 | Lin et al. | |
| 2007/0122981 A1 | 5/2007 | Park | |
| 2010/0013017 A1* | 1/2010 | Tsutsui | H01L 21/823462 438/770 |

* cited by examiner

*Primary Examiner* — Asok K Sarkar
(74) *Attorney, Agent, or Firm* — Yudong Kim; Frank D. Cimino

(57) ABSTRACT

A semiconductor device including a first dielectric layer and a second dielectric layer is formed by forming an inhibitor layer over a semiconductor material. The inhibitor layer includes at least silicon and nitrogen. The semiconductor material is heated in an oxygen-containing ambient which oxidizes the inhibitor layer and forms the first dielectric layer which includes the oxidized inhibitor layer, and oxidizes the semiconductor material to form the second dielectric layer. The second dielectric layer is thicker than, the first dielectric layer. The first dielectric layer and the second dielectric layer each include at least 90 weight percent silicon dioxide and less than 1 weight percent nitrogen. The first dielectric layer and the second dielectric layer may be used to form gate dielectric layers for a first MOS transistor and a second MOS transistor that operates at a higher voltage than the first MOS transistor.

29 Claims, 17 Drawing Sheets

DUAL GATE DIELECTRIC LAYERS GROWN WITH AN INHIBITOR LAYER

CROSS-REFERENCE TO RELATED APPLICATION

This application is a Divisional of U.S. patent application Ser. No. 16/836,755 filed Mar. 31, 2020, which is incorporated herein by reference.

FIELD

This disclosure relates to the field of semiconductor devices. More particularly, this disclosure relates to dielectric layers in semiconductor devices.

BACKGROUND

Some semiconductor devices include transistors with gate dielectric layers having two different thicknesses. In some cases, the transistors with thicker gate dielectric layers are used for input/output functions, and the transistors with thinner gate dielectric layers are used for internal signal processing functions. Forming the gate dielectric layers having two different thicknesses is commonly done using separate oxidation furnace processes, which increases cost and cycle time. Attaining consistent thickness control and reliability in the gate dielectric layers has proven to be challenging.

SUMMARY

The present disclosure introduces a method of forming a semiconductor device including a first dielectric layer and a second dielectric layer that is thicker than, the first dielectric layer. An inhibitor layer is formed over a semiconductor material in an area for the first dielectric layer. The inhibitor layer includes at least silicon and nitrogen. The semiconductor material is heated in an oxygen-containing ambient which oxidizes the inhibitor layer and forms the first dielectric layer which includes the oxidized inhibitor layer, and oxidizes the semiconductor material to form the second dielectric layer. The first dielectric layer and the second dielectric layer each include at least 90 weight percent silicon dioxide.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device including a first dielectric layer and a second dielectric layer is formed by forming an inhibitor layer over a semiconductor material of the semiconductor device in an area for the first dielectric layer. The inhibitor layer includes at least silicon and nitrogen, and may include oxygen or carbon, or both. The semiconductor material is heated while exposed to an ambient containing oxygen, which concurrently forms the first dielectric layer and the second dielectric layer. The inhibitor layer is oxidized by the ambient containing oxygen, and the nitrogen is removed from the inhibitor layer, to form an oxidized inhibitor layer. The first dielectric layer includes the oxidized inhibitor layer and an oxidized semiconductor material layer between the oxidized inhibitor layer and the semiconductor material. The second dielectric layer is thicker than the first dielectric layer. Both the first dielectric layer and the second dielectric layer include at least 90 weight percent silicon dioxide, and less than 1 weight percent nitrogen. Forming the first dielectric layer and the second dielectric layer using the inhibitor layer has demonstrated superior thickness consistency and dielectric reliability compared to other methods.

It is noted that terms such as top, bottom, over, above, and below may be used in this disclosure. These terms should not be construed as limiting the position or orientation of a structure or element, but should be used to provide spatial relationship between structures or elements.

Figure 1A:
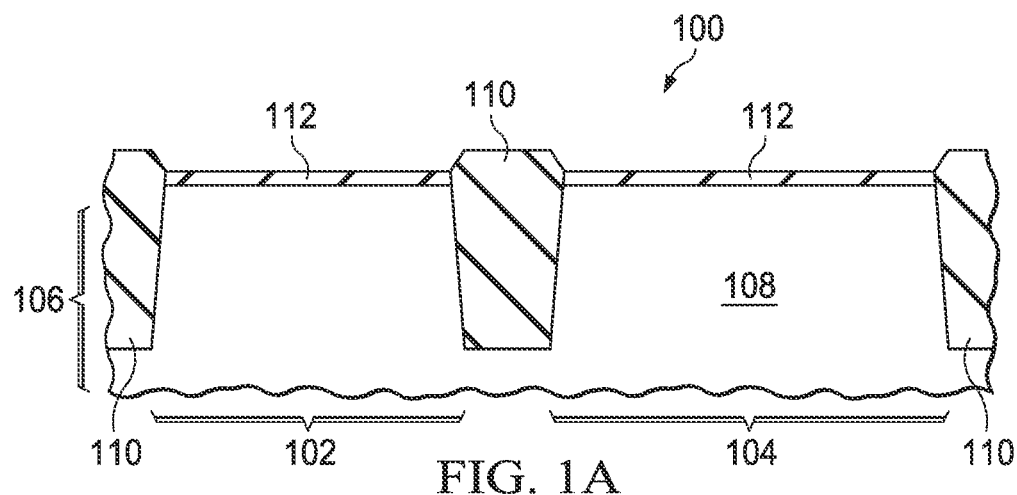
FIG. 1A through FIG. 1L are cross sections of a semiconductor device including a first dielectric layer and a second dielectric layer, depicted in stages of an example method of formation.

FIG. 1A through FIG. 1L are cross sections of a semiconductor device 100 including a first dielectric layer 102 and a second dielectric layer 104, depicted in stages of an example method of formation. Referring to FIG. 1A, the semiconductor device 100 is formed on a substrate 106 which includes a semiconductor material 108. The substrate 106 may be implemented as a semiconductor wafer, a microelectromechanical systems (MEMS) substrate, an electro-optical device substrate, a micro-optical mechanical systems substrate, or a microfluidics substrate, by way of example. The substrate 106 may include additional semiconductor devices, not shown. The semiconductor material 108 may include silicon, and may include primarily silicon and dopants to provide a desired electrical conductivity.

The semiconductor device 100 may include field oxide 110, formed in the substrate 106, which laterally separates an area for the first dielectric layer 102 from an area for the second dielectric layer 104. For the purposes of this disclosure, the terms "laterally" and "lateral" refer to directions parallel to a surface of the semiconductor material 108 upon which the first dielectric layer 102 and the second dielectric layer 104 are formed, and similarly for other examples disclosed herein. The field oxide 110 may be formed by a shallow trench isolation (STI) process, which includes forming trenches in the semiconductor material 108 and filling the trenches with silicon dioxide-based dielectric material, followed by planarizing the silicon dioxide-based dielectric material. Instances of the field oxide 110 formed by an STI process may have straight sidewalls in the semiconductor material 108, as depicted in FIG. 1A, and may extend less than 200 nanometers above the semiconductor material 108. Alternatively, the field oxide 110 may be formed by a local oxidation of silicon (LOCOS) process. Other methods of forming the field oxide 110 are within the scope of this example.

There may be a protective dielectric layer 112 on the semiconductor material 108 to protect a surface of the semiconductor material 108 in the areas for the first dielectric layer 102 and the second dielectric layer 104 during some fabrication processes, such as photolithographic processes, ion implant processes, and etch and cleanup processes. The protective dielectric layer 112 may include, for example, 5 nanometers to 100 nanometers of silicon dioxide.

Figure 1B:
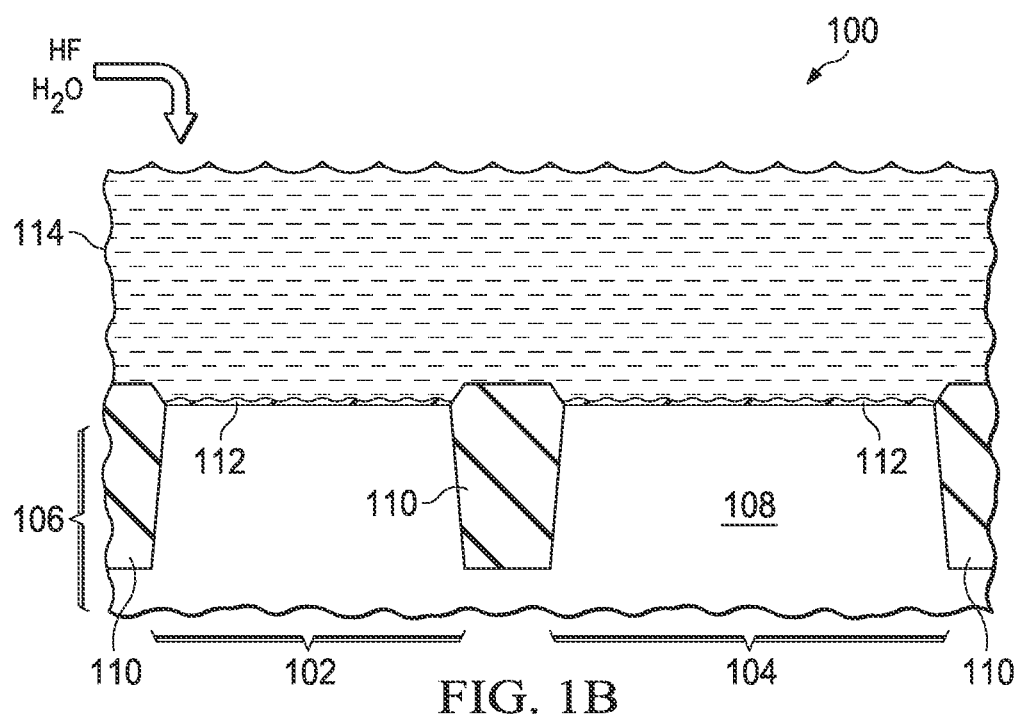

Referring to FIG. 1B, the protective dielectric layer 112 is removed from the surface of the semiconductor material 108 in the areas for the first dielectric layer 102 and the second dielectric layer 104. The protective dielectric layer 112 may be removed by a wet etch process using a first aqueous etch solution 114 of dilute hydrofluoric acid in deionized water, labeled "HF" and "H$_2$O", respectively, in FIG. 1B. FIG. 1B depicts removal of the protective dielectric layer 112 partway to completion.

Figure 1C:
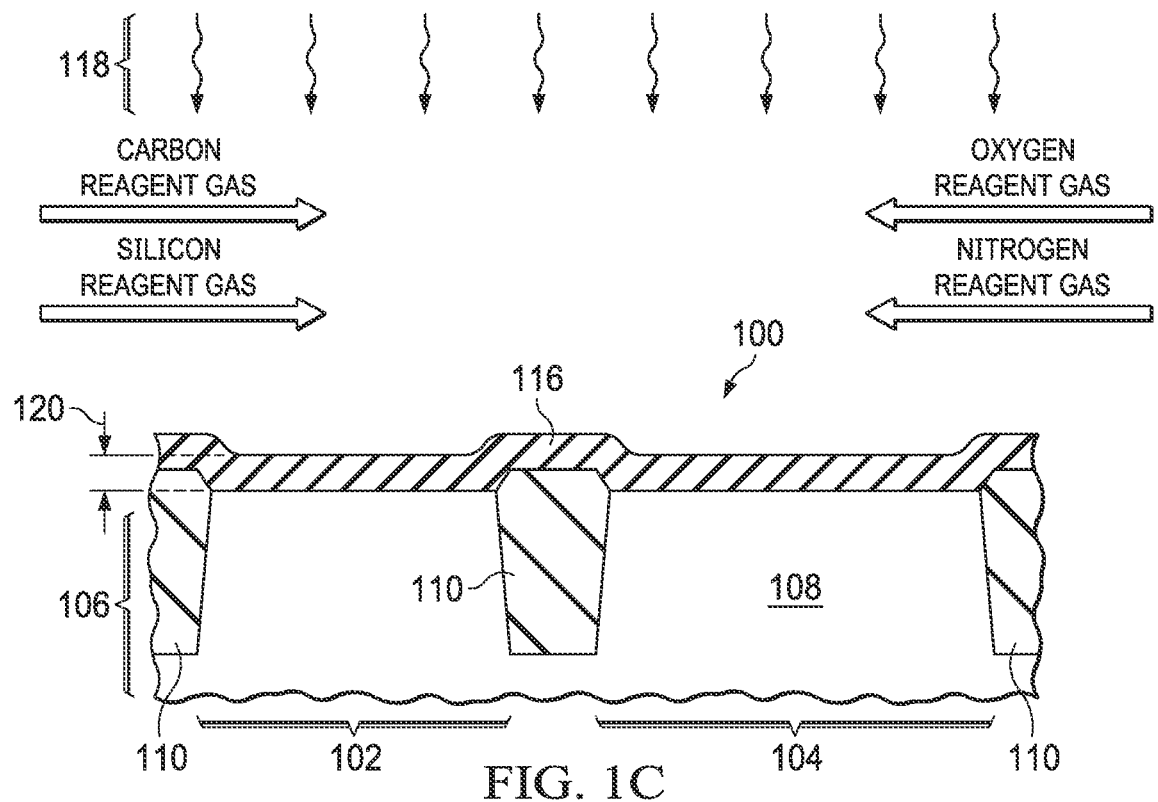

Referring to FIG. 1C, an inhibitor layer 116 is formed over the semiconductor material 108 in the areas for the first dielectric layer 102 and the second dielectric layer 104. In this example, the inhibitor layer 116 may be formed by a chemical vapor deposition (CVD) process in which the substrate 106 is heated by a first heating process 118, which may be implemented as a furnace process or a heated wafer chuck, by way of example. While the substrate 106 is heated, one or more silicon-containing reagent gases, labeled "SILICON REAGENT GAS" in FIG. 1C, and one or more nitrogen-containing reagent gases, labeled "NITROGEN REAGENT GAS" in FIG. 1C, are flowed into an ambient contacting the semiconductor material 108. Optionally, one or more oxygen-containing reagent gases, labeled "OXYGEN REAGENT GAS" in FIG. 1C, or one or more carbon-containing reagent gases, labeled "CARBON REAGENT GAS" in FIG. 1C, or both the oxygen-containing reagent gases and the carbon-containing reagent gases, may be flowed into the ambient contacting the semiconductor material 108. In one version of this example, the CVD process may be implemented as a low pressure chemical vapor deposition (LPCVD) process, and the silicon-containing reagent gases and nitrogen-containing reagent gases may be implemented as dichlorosilane and ammonia, respectively. In another version of this example, the CVD process may be implemented as an LPCVD process, and the silicon-containing reagent gases and nitrogen-containing reagent gases may be implemented as a combination of bis(tertiary-butylamino)silane (BTBAS), ammonia, and nitrogen (N$_2$) gas. The BTBAS provides the silicon-containing reagent gas, as well as a portion of the nitrogen-containing reagent gases, and provides a carbon-containing reagent gas. In a further version of this example, the silicon-containing reagent gases may be provided by a combination of BTBAS and tetraethoxysilane (TEOS), also referred to as tetraethyl orthosilicate. The BTBAS provides the nitrogen-containing reagent gas and a portion of the carbon-containing reagent gases. The TEOS provides the oxygen-containing reagent gas and another portion of the carbon-containing reagent gases. Other implementations of the silicon-containing reagent gases, the nitrogen-containing reagent gases, the oxygen-containing reagent gases, and the carbon-containing reagent gases are within the scope of this example.

The inhibitor layer 116 includes silicon and nitrogen, and may optionally include oxygen or carbon, or both. The inhibitor layer 116 may have an atomic ratio of silicon to nitrogen greater than 0.75, to provide a desired rate of oxidation during formation of the first dielectric layer 102 and the second dielectric layer 104, shown in FIG. 1I. Moreover, the inhibitor layer 116 is not composed of stoichiometric silicon nitride (Si$_3$N$_4$), as the rate of oxidation is too low. The inhibitor layer 116 may include 1 atomic percent oxygen to 20 atomic percent oxygen, and may include 1 atomic percent carbon to 15 atomic percent carbon, to further provide a desired rate of oxidation during formation of the first dielectric layer 102 and the second dielectric layer 104. The inhibitor layer 116 may have an inhibitor layer thickness 120 of 1.8 nanometers to 8.0 nanometers in the area for the first dielectric layer 102, which has been demonstrated to provide desired thicknesses for the first dielectric layer 102 and the second dielectric layer 104. Having the inhibitor layer thickness 120 of the inhibitor layer 116 lower than 1.8 nanometers may result in the first dielectric layer 102 being thicker than desired. Having the inhibitor layer thickness 120 of the inhibitor layer 116 greater than 8.0 nanometers may result in the inhibitor layer 116 being incompletely oxidized when the second dielectric layer 104 reaches a desired thickness during the oxidation process.

Thicknesses of the first dielectric layer 102 and the second dielectric layer 104 that are too high for gate dielectric layers of metal oxide semiconductor (MOS) transistors. In this example, the semiconductor material 108 may have a native oxide layer, not shown in FIG. 1C, on the surface of the semiconductor material 108 in the areas for the first dielectric layer 102 and the second dielectric layer 104, and the inhibitor layer 116 may be formed on the native oxide layer. Forming the inhibitor layer 116 by a CVD process or an LPCVD process may advantageously provide desired concentrations of silicon, nitrogen, oxygen, and carbon in the inhibitor layer 116 in a single process operation.

Figure 1D:
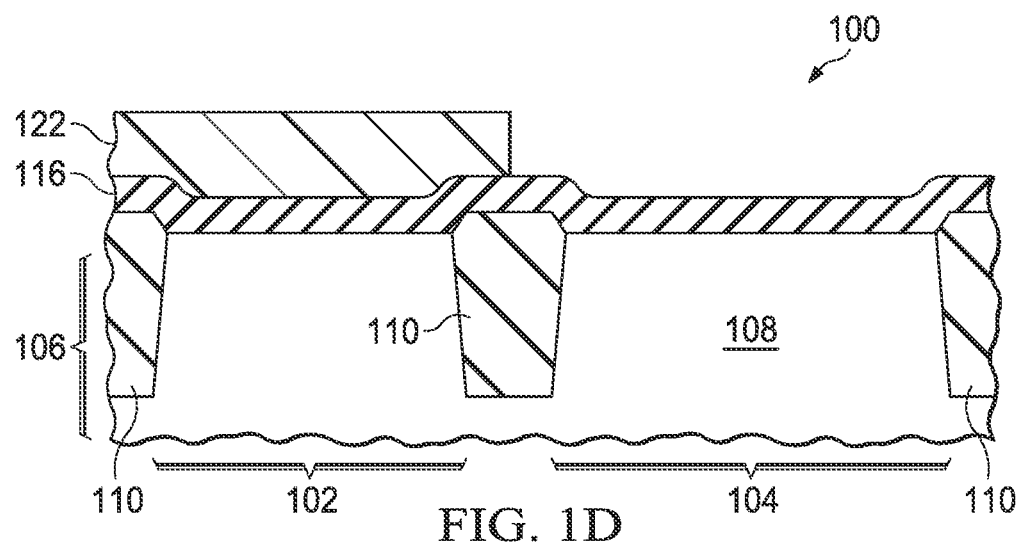

Referring to FIG. 1D, an inhibitor mask 122 is formed over the inhibitor layer 116, covering the area for the first dielectric layer 102 and exposing the inhibitor layer 116 in the area for the second dielectric layer 104. The inhibitor mask 122 may include photoresist, and may be formed by a photolithographic process. The inhibitor mask 122 may also include anti-reflection material, such as a bottom anti-reflection coat (BARC).

Figure 1E:
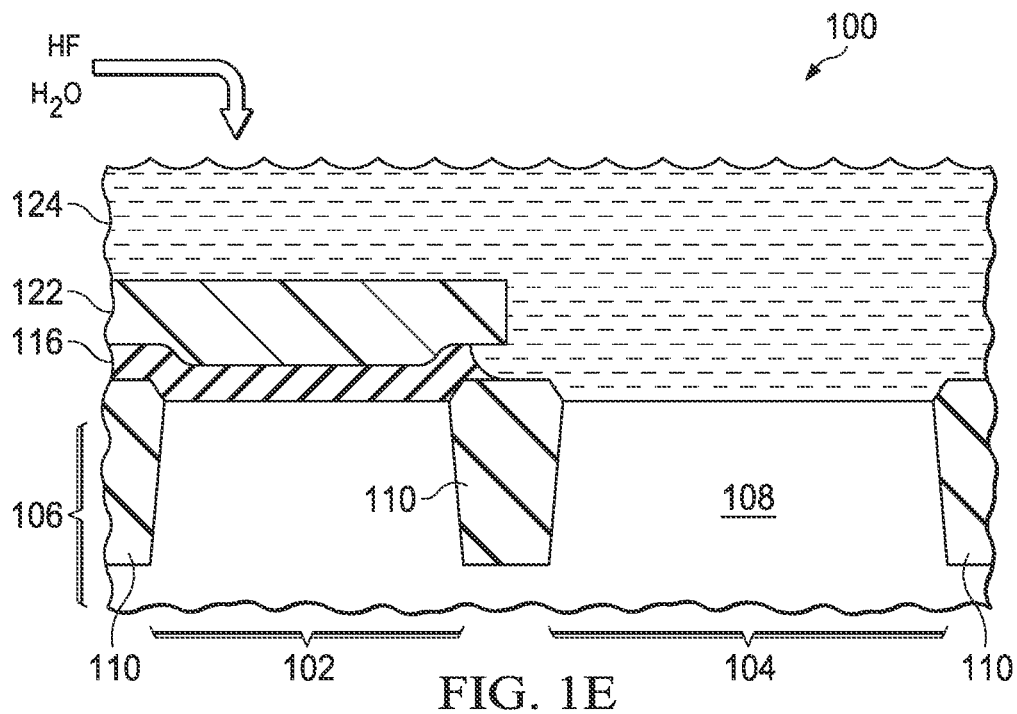

Referring to FIG. 1E, the inhibitor layer 116 is removed where exposed by the inhibitor mask 122. The inhibitor layer 116 may be removed by a wet etch process using a second aqueous etch solution 124 of dilute hydrofluoric acid in deionized water, labeled "HF" and "H$_2$O", respectively, in FIG. 1E. In versions of this example in which the second aqueous etch solution 124 has a concentration of hydrofluoric acid around 1 percent, the wet etch process may be carried out for 600 seconds to 1200 seconds, by way of example. An etch rate of the inhibitor layer 116 in the second aqueous etch solution 124 may depend on the relative amounts of silicon, nitrogen, oxygen, and carbon in the inhibitor layer 116. FIG. 1E depicts removal of the inhibitor layer 116 in the area for the second dielectric layer 104 at completion. The inhibitor layer 116 remains in place in the area for the first dielectric layer 102, protected from the second aqueous etch solution 124 by the inhibitor mask 122.

Figure 1F:
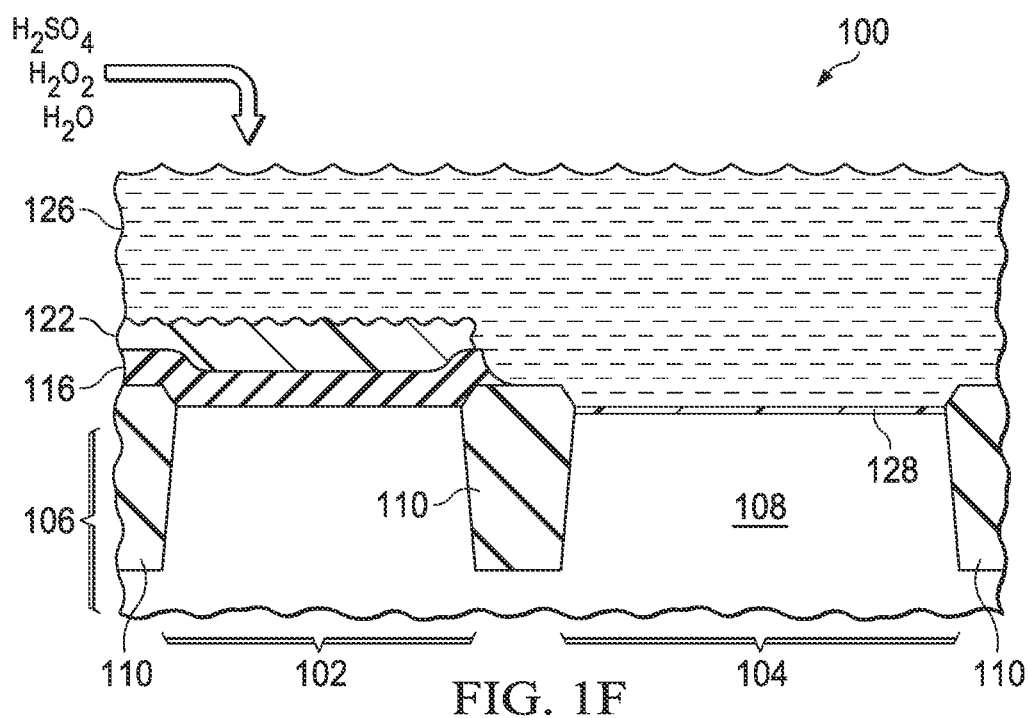

Referring to FIG. 1F, the inhibitor mask 122 is removed, so as to avoid damage to the semiconductor material 108 in the area for the second dielectric layer 104. The inhibitor mask 122 may be removed by a first wet clean process using a first aqueous cleanup solution 126 which includes sulfuric acid, hydrogen peroxide, and deionized water, labeled "H₂SO₄", "H₂O₂", and "H₂O", respectively, in FIG. 1F. The first aqueous cleanup solution 126 is sometimes referred to as a piranha solution. FIG. 1F depicts removal of the first inhibitor mask 122 partway to completion. The first wet clean process may form a chemical oxide layer 128 on the semiconductor material 108 in the area for the second dielectric layer 104.

Figure 1G:
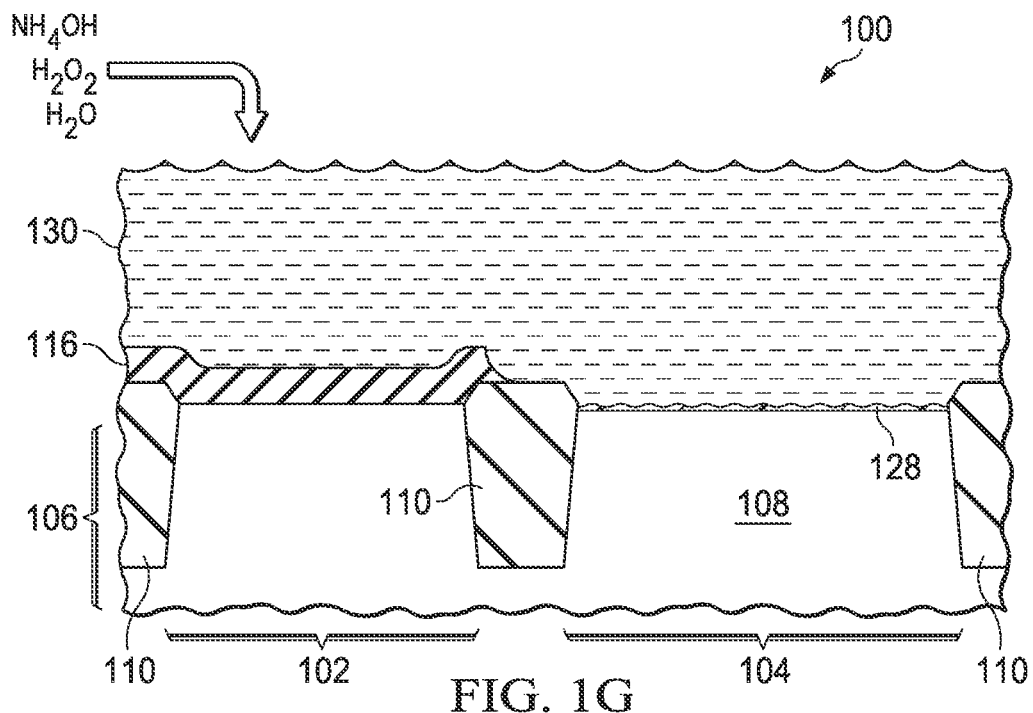
Figure 1H:
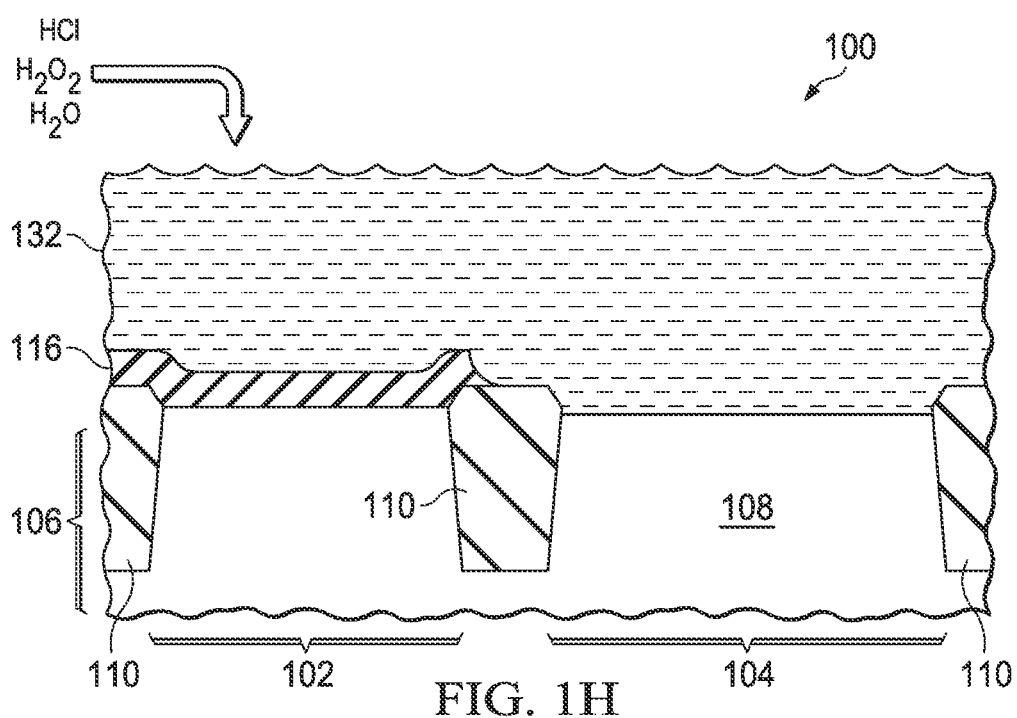
Figure 1I:
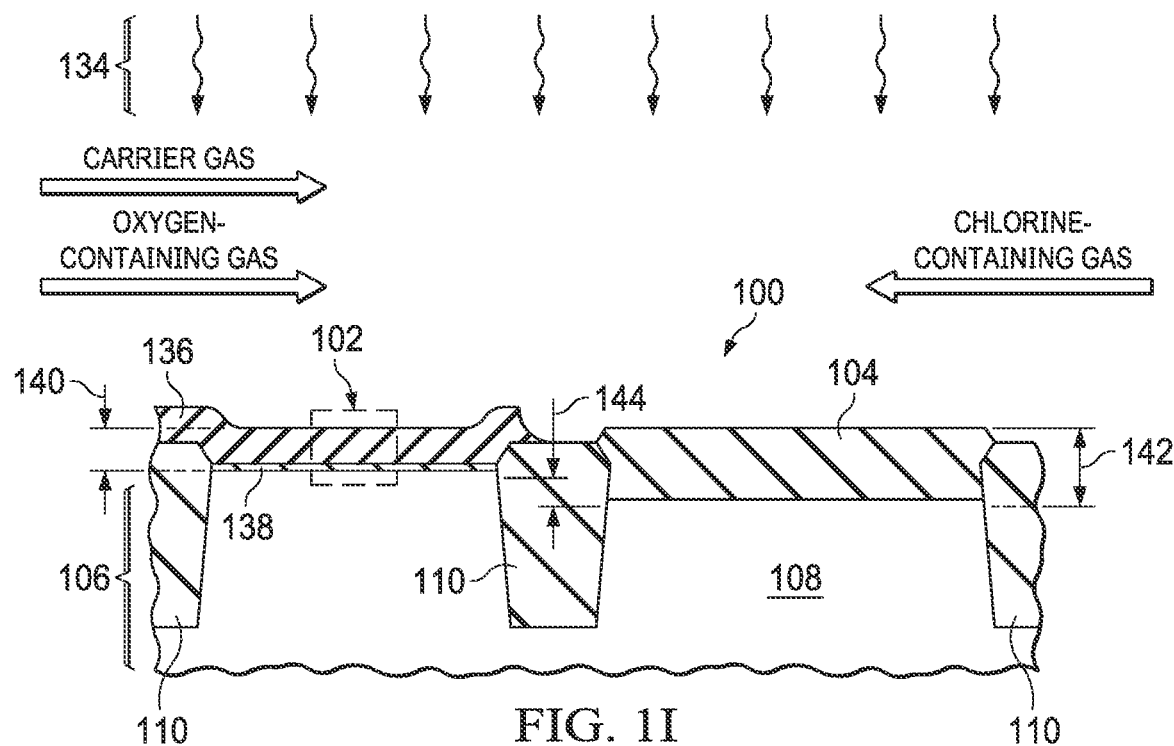

Referring to FIG. 1G, the chemical oxide layer 128 is removed to provide a clean surface on the semiconductor material 108 for formation of the second dielectric layer 104, shown in FIG. 1I. The chemical oxide layer 128 may be removed by a second wet clean process using a second aqueous cleanup solution 130 which includes ammonium hydroxide, hydrogen peroxide, and deionized water, labeled "NH₄OH", "H₂O₂", and "H₂O", respectively, in FIG. 1G. The second aqueous cleanup solution 130 is sometimes referred to as an SC-1 solution. FIG. 1G depicts removal of the chemical oxide layer 128 partway to completion. The second aqueous cleanup solution 130 may form a thin oxide layer, not shown in FIG. 1G, on the surface on the semiconductor material 108 after removing the chemical oxide layer 128.

Referring to FIG. 1H, the semiconductor device 100 is cleaned by a third wet clean process using a third aqueous cleanup solution 132 which includes hydrochloric acid, hydrogen peroxide, and deionized water, labeled "HCl", "H₂O₂", and "H₂O", respectively, in FIG. 1H. The third aqueous cleanup solution 132 is sometimes referred to as an SC-2 solution. The third aqueous cleanup solution 132 may advantageously remove metal contaminants from the surface of the semiconductor device 100. The third aqueous cleanup solution 132 may also remove the thin oxide layer formed by the second aqueous cleanup solution 130 of FIG. 1G.

Referring to FIG. 1I, a thermal oxidation process is performed in which the substrate 106 is heated by a second heating process 134 while an oxygen-containing gas, labeled "OXYGEN-CONTAINING GAS" is flowed into an ambient contacting the inhibitor layer 116 of FIG. 1H and contacting the semiconductor material 108 to provide oxygen in the ambient. The second heating process 134 may heat the substrate 106 to 800° C. to 1000° C., and may be implemented as a furnace heating process, for example. The oxygen-containing gas may be implemented as dry oxygen gas ($O_2$), a combination of dry oxygen gas ($O_2$) and hydrogen gas ($H_2$), water vapor ($H_2O$) or any combination thereof. Other implementations of the oxygen-containing gas are within the scope of this example. The oxygen in the ambient oxidizes the inhibitor layer 116 to form an oxidized inhibitor layer 136 and oxidizes the semiconductor material 108 under the inhibitor layer 116 to form an oxidized semiconductor material layer 138 between the oxidized inhibitor layer 136 and the semiconductor material 108. The nitrogen in the inhibitor layer 116 is removed during the thermal oxidation process, for example by reaction with oxygen to form a volatile gas. The first dielectric layer 102 includes the oxidized inhibitor layer 136 and the oxidized semiconductor material layer 138. The thermal oxidation process concurrently forms the second dielectric layer 104 by oxidizing silicon in the semiconductor material 108. Formation of the oxidized semiconductor material layer 138 may proceed slowly at a beginning of the thermal oxidation process, before the inhibitor layer 116 is significantly oxidized, and may proceed more quickly after the inhibitor layer 116 is significantly oxidized.

A carrier gas, labeled "CARRIER GAS" in FIG. 1I, may be flowed into the ambient contacting the inhibitor layer 116 and the semiconductor material 108, to dilute the oxygen-containing gas to attain desired oxidation rates of the inhibitor layer 116 and the silicon in the semiconductor material 108. The carrier gas may include nitrogen, for example.

A chlorine-containing gas, labeled "CHLORINE-CONTAINING GAS" labeled in FIG. 1I, may be flowed into the ambient contacting the inhibitor layer 116 and the semiconductor material 108, to catalyze oxidation of nitrogen in the inhibitor layer 116. A mass flow rate of chlorine may be 2 percent to 8 percent of the total gas flow into the ambient. The chlorine-containing gas may be implemented as trans-dichloroethylene, which advantageously dissociates at a lower temperature than cis-dichloroethylene, due to trans-dichloroethylene having a smaller dipole moment than cis-dichloroethylene, and thus provides a more efficient source of chlorine for the catalysis of oxidation of nitrogen in the inhibitor layer 116.

The first dielectric layer 102 includes at least 90 weight percent silicon dioxide. Similarly, the second dielectric layer 104 includes at least 90 weight percent silicon dioxide. The first dielectric layer 102 and the second dielectric layer 104 may each include at least 99 weight percent silicon dioxide immediately after being formed, that is at completion of the thermal oxidation process. Additional elements such as fluorine and boron may be introduced into the first dielectric layer 102 and the second dielectric layer 104 during subsequent fabrication steps to form the semiconductor device 100, so that the first dielectric layer 102 and the second dielectric layer 104 in the completed semiconductor device 100 includes at least 90 weight percent silicon dioxide. Furthermore, the first dielectric layer 102 may be essentially free of nitrogen, that is, the first dielectric layer 102 may include only a trace amount of nitrogen which does not affect functionality of the first dielectric layer 102. For example, the first dielectric layer 102 may have less than 1 weight percent nitrogen. The first dielectric layer 102 has a first thickness 140 that is greater than the inhibitor layer thickness 120 of the inhibitor layer 116 of FIG. 1C. The first thickness 140 may range from 2.4 nanometers to 25 nanometers, by way of example. The second dielectric layer 104 has a second thickness 142 that is at least 40 percent greater than the first thickness 140, to provide a higher operating voltage for a subsequently-formed second MOS transistor 158, shown in FIG. 1L, that includes the second dielectric layer 104. The second thickness 142 is no more than 5 times the first thickness 140, to attain desired values of drive current and threshold voltage in the subsequently-formed second MOS transistor 158. The second thickness 142 may range from 10 nanometers to 100 nanometers, by way of example. Because the second dielectric layer 104 is completely formed by thermal oxidation of silicon in the semiconductor material 108 which consumes approximately 0.46 nanometers of silicon for every 1.00 nanometers of the second dielectric layer 104 formed, and whereas in the first dielectric layer 102, thermal oxidation of silicon is reduced by the inhibitor layer 116, the second dielectric layer 104 extends further into the semiconductor material 108 than the first dielectric layer 102 by a depth difference 144 that is greater than 30 percent of a difference between the second thickness 142 and the first thickness 140. Forming the first dielectric layer 102 and the second dielectric layer 104 using the inhibitor layer 116 has demonstrated superior thickness consistency and dielectric reliability for both the first dielectric layer 102 and the second dielectric layer 104, compared to other methods.

The thermal oxidation process has a thermal profile and ambient profile, that is, a combination of time durations, temperatures, and ambient compositions of steps in the thermal oxidation process, to form the second dielectric layer 104 with the desired composition and the desired value of the second thickness 142, by thermal oxidation of silicon. The composition of the inhibitor layer 116 and the inhibitor layer thickness 120 are selected to provide the desired composition of the first dielectric layer 102 and the desired value of the first thickness 140 during the thermal oxidation process, so that the first dielectric layer 102 and the second dielectric layer 104 are formed concurrently.

Figure 1J:
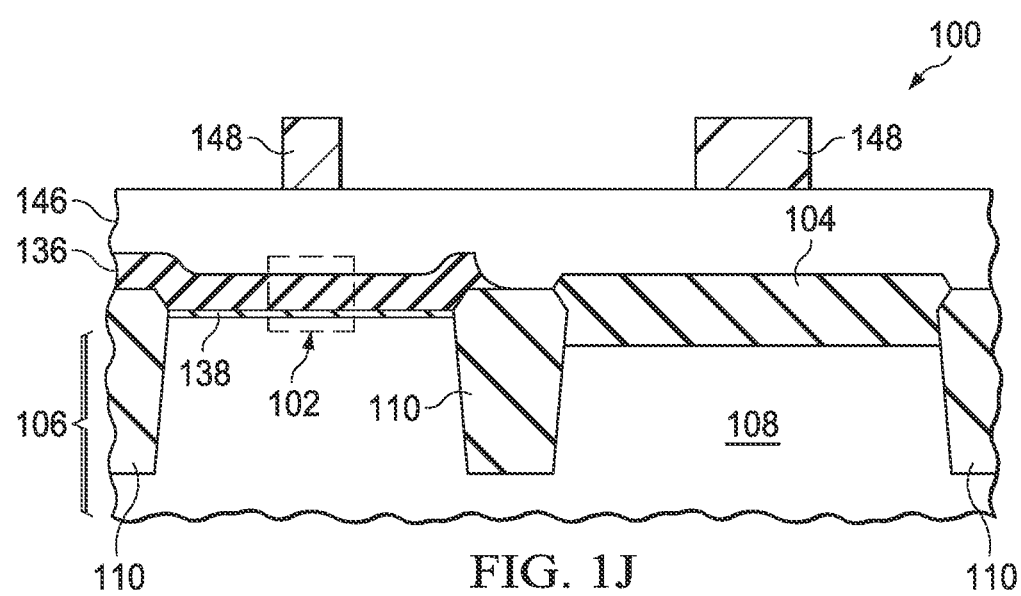

Referring to FIG. 1J, a gate material layer 146 is formed over the first dielectric layer 102 and the second dielectric layer 104. The gate material layer 146 may include polycrystalline silicon, aluminum, metal silicide, or may include one or more sublayers of gate material such as titanium nitride. A gate mask 148 is formed over the gate material layer 146, covering an area for a first gate 150, shown in FIG. 1K, over the first dielectric layer 102, and covering an area for a second gate 152, also shown in FIG. 1K, over the second dielectric layer 104. The gate mask 148 may include photoresist, and may be formed by a photolithographic process. The gate mask 148 may include anti-reflection material, and may also include hard mask material, such as silicon dioxide.

Figure 1K:
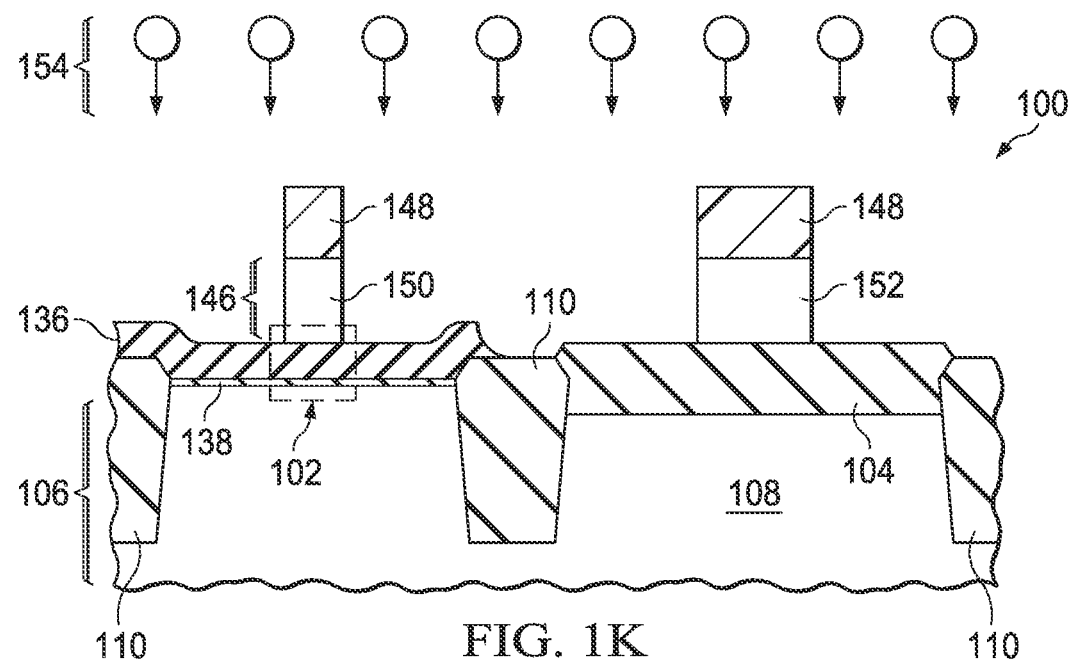

Referring to FIG. 1K, the gate material layer 146 is removed where exposed by the gate mask 148, leaving a first portion of the gate material layer 146 over the first dielectric layer 102 to form the first gate 150, and leaving a second portion of the gate material layer 146 over the second dielectric layer 104 to form the second gate 152. The gate material layer 146 may be removed by a reactive ion etch (ME) process using halogens 154 such as fluorine. The second gate 152 may have a longer gate length than the first gate 150, as indicated in FIG. 1K. The gate mask 148 is subsequently removed, leaving the first gate 150 and the second gate 152 in place. Photoresist and organic anti-reflection material in the gate mask 148 may be removed by a plasma process using oxygen radicals, such as an asher process, a downstream asher process, or an ozone process, followed by a wet clean process. Hard mask material in the gate mask 148 may be removed by a plasma process using fluorine radicals, such as an RIE process.

Figure 1L:
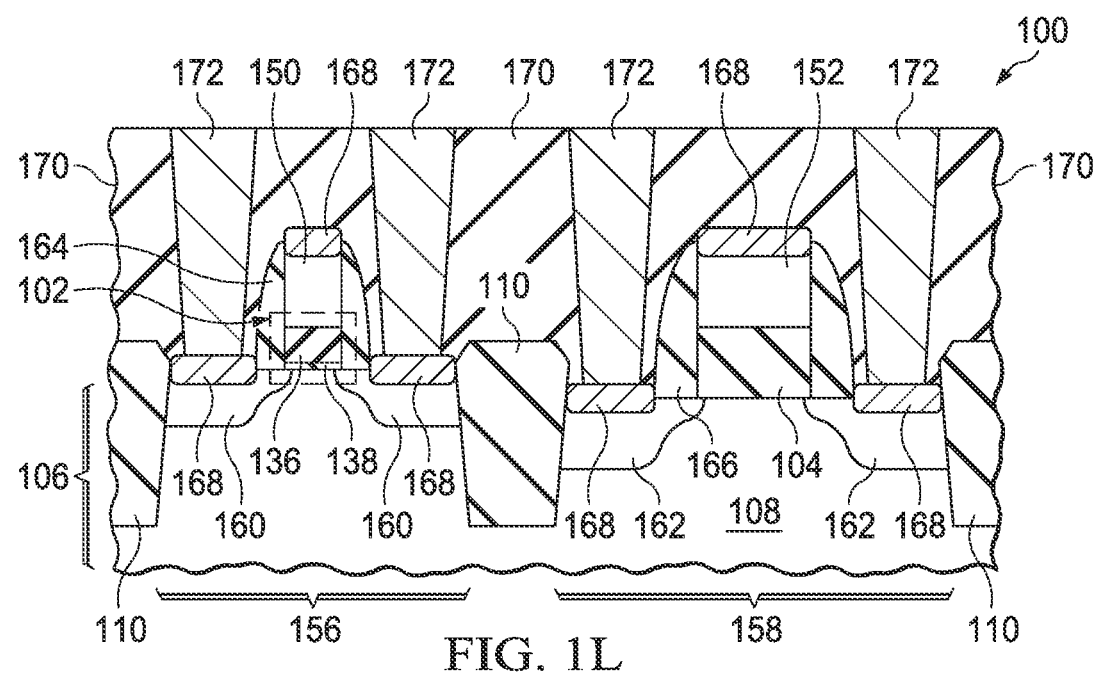

Referring to FIG. 1L, formation of the semiconductor device 100 is continued with formation of a first MOS transistor 156 that includes the first dielectric layer 102 and formation of the second MOS transistor 158 that includes the second dielectric layer 104. The first dielectric layer 102 provides a first gate dielectric layer 102 for the first MOS transistor 156, and the second dielectric layer 104 provides a second gate dielectric layer 104 for the second MOS transistor 158. First source/drain regions 160 are formed in the semiconductor material 108 adjacent to the first gate 150. Second source/drain regions 162 are formed in the semiconductor material 108 adjacent to the second gate 152.

Portions of the first dielectric layer 102 that are exposed by the first gate 150 may be removed, as indicated in FIG. 1L. Similarly, portions of the second dielectric layer 104 that are exposed by the second gate 152 may be removed, as indicated in FIG. 1L. First gate sidewall spacers 164 are formed on lateral surfaces of the first gate 150, and second gate sidewall spacers 166 are formed on lateral surfaces of the second gate 152. The first gate sidewall spacers 164 and the second gate sidewall spacers 166 may include one or more layers of silicon nitride, silicon dioxide, or silicon oxynitride, and may be formed concurrently or separately, by one or more CVD processes.

Metal silicide 168 may be formed on the first source/drain regions 160 adjacent to the first gate sidewall spacers 164, on the second source/drain regions 162 adjacent to the second gate sidewall spacers 166, on the first gate (150, and on the second gate 152. The metal silicide 168 may include titanium silicide, cobalt silicide, or nickel silicide, by way of example.

A pre-metal dielectric (PMD) layer 170 may be formed over the first MOS transistor 156 and the second MOS transistor 158. The PMD layer 170 may include one or more sublayers of dielectric material. For example, the PMD layer 170 may include a PMD liner of silicon nitride over the first MOS transistor 156 and the second MOS transistor 158, a planarized oxide layer on the PMD liner, and a PMD cap layer of silicon carbide or silicon nitride on the planarized oxide layer. Other sublayer structures for the PMD layer 170 are within the scope of this example. The sublayers of the PMD layer 170 may be formed by a sequence of CVD processes, LPCVD processes, and plasma enhanced chemical vapor deposition (PECVD) processes.

Contacts 172 may be formed through the PMD layer 170 to make electrical connections to the first MOS transistor 156 and the second MOS transistor 158. The contacts are electrically conductive, and may be formed by etching contact holes through the PMD layer 170 to the metal silicide 168. An adhesion sublayer of titanium may be formed in the contact hole, and over a top surface of the PMD layer 170, by a sputter process. A barrier sublayer of titanium nitride or tantalum nitride may be formed on the adhesion layer by a reactive sputter process or an atomic layer deposition (ALD) process. A contact fill metal of tungsten may be formed on the barrier sublayer by a metal organic chemical vapor deposition (MOCVD) process using silane and hydrogen to reduce tungsten hexafluoride. Subsequently, the contact fill metal, the barrier sublayer, and the adhesion sublayer are removed from over the top surface of the PMD layer 170 by a chemical mechanical polish (CMP) process, an etchback process, or a combination of both processes. Other sublayer structures, compositions, and methods of formation for the contacts 172 are within the scope of this example. Attaining superior thickness consistency and dielectric reliability for both the first dielectric layer 102 and the second dielectric layer 104 may advantageously provide superior threshold and drive current consistency for both the first MOS transistor 156 and the second MOS transistor 158, as well as improved reliability for the semiconductor device 100.

Figure 2A:
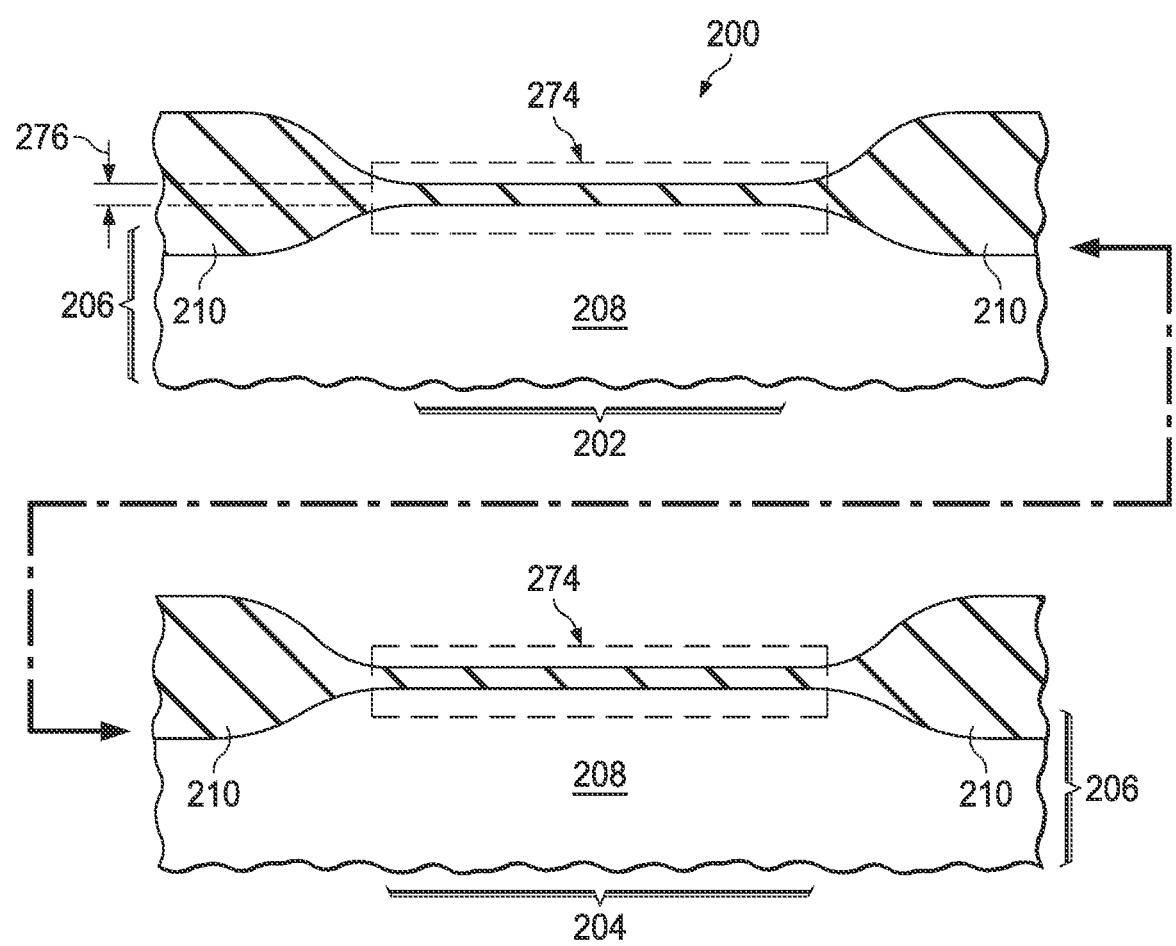
FIG. 2A through FIG. 2H are cross sections of a semiconductor device including a first dielectric layer and a second dielectric layer, depicted in stages of another example method of formation.

FIG. 2A through FIG. 2H are cross sections of a semiconductor device 200 including a first dielectric layer 202 and a second dielectric layer 204, depicted in stages of another example method of formation. Referring to FIG. 2A, the semiconductor device 200 is formed on a substrate 206 which includes a semiconductor material 208. The substrate 206 may be implemented as any of the examples disclosed in reference to the substrate 106 of FIG. 1A. The semiconductor material 208 may include silicon.

The semiconductor device 200 may include field oxide 210, formed on the substrate 206, which laterally separates an area for the first dielectric layer 202 from an area for the second dielectric layer 204. The field oxide 210 may be formed by a LOCOS process, which includes forming a layer of silicon nitride over the semiconductor material 208 with openings for the field oxide 210. The field oxide 210 is formed by thermal oxidation of the semiconductor material 208 where exposed by the silicon nitride layer. The silicon nitride layer is subsequently removed. Instances of the field oxide 210 formed by a LOCOS process may have tapered edges, commonly referred to as "birds' beaks," as depicted in FIG. 2A, and may extend higher above a top surface of the semiconductor material 208 than below the top surface. Other methods of forming the field oxide 210 are within the scope of this example.

An inhibitor starter layer 274 is formed on the semiconductor material 208 in the areas for the first dielectric layer 202 and the second dielectric layer 204. In one version of this example, the inhibitor starter layer 274 may consist essentially of silicon dioxide, and may be formed by thermal oxidation of silicon in the semiconductor material 208. For the purposes of this disclosure, the phrase "consist essentially of silicon dioxide" is understood to mean the inhibitor starter layer 274 has primarily the silicon dioxide, with any other materials, such as nitrogen or carbon, being present in trace amounts that do not affect functionality of the inhibitor starter layer 274. Thus, the inhibitor starter layer 274 may have less than 1 weight percent total amount of other elements, such as nitrogen and carbon. In another version of this example, the inhibitor starter layer 274 may include an amorphous mixture of silicon, oxygen, and carbon, and may be formed by a CVD process on a native oxide layer on the semiconductor material 208. The inhibitor starter layer 274 may have a starter layer thickness 276 in the area for the first dielectric layer 202 that is 0.5 nanometers to 2.0 nanometers thinner than an inhibitor layer thickness 220 of a subsequently-formed inhibitor layer 216, shown in FIG. 2B.

Figure 2B:
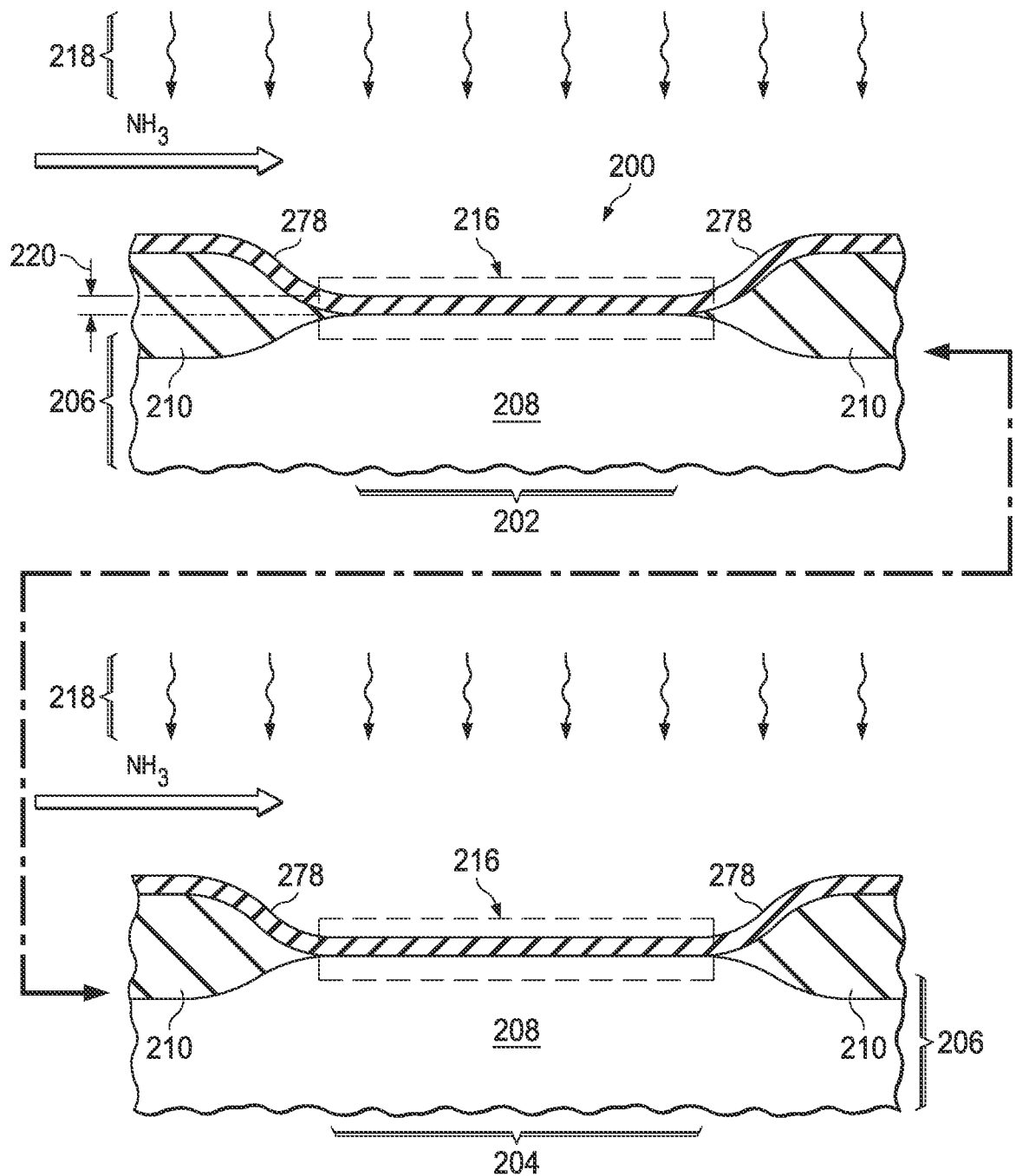

Referring to FIG. 2B, the substrate 206 is heated to 600° C. to 1200° C. by a first heating process 218. The first heating process 218 may be implemented as a furnace heating process, or a rapid thermal process (RTP), by way of example. While the substrate 206 is heated, ammonia gas, labeled "$NH_3$" in FIG. 2B, is flowed into an ambient contacting the inhibitor starter layer 274 of FIG. 2A. The ammonia gas may have a pressure of 1 torr to 760 torr, by way of example.

Nitrogen from the ammonia gas is incorporated into the inhibitor starter layer 274 to form the inhibitor layer 216 on the semiconductor material 208 in the areas for the first dielectric layer 202 and the second dielectric layer 204. A higher pressure of the ammonia gas and a higher temperature of the substrate 206 may provide a higher rate of incorporation of the nitrogen into the inhibitor starter layer 274, advantageously improving a cycle time for forming the inhibitor layer 216. Conversely, a lower pressure of the ammonia gas and a lower temperature of the substrate 206 may provide more control on the amount of the nitrogen that is incorporated into the inhibitor starter layer 274, advantageously improving consistency of the subsequently-formed first dielectric layer 202, shown in FIG. 2H. The pressure of the ammonia gas and the temperature of the substrate 206 may be selected to provide a desired balance between the cycle time and control on the amount of the nitrogen. Forming the inhibitor layer 216 by starting with the inhibitor starter layer 274 of silicon dioxide and using the ammonia gas may advantageously provide more process control for the amount of nitrogen incorporation into the inhibitor layer 216 than other methods. Additional nitrogen from the ammonia gas may be incorporated into a surface layer 278 of the field oxide 210, as indicated in FIG. 2B.

Figure 2C:
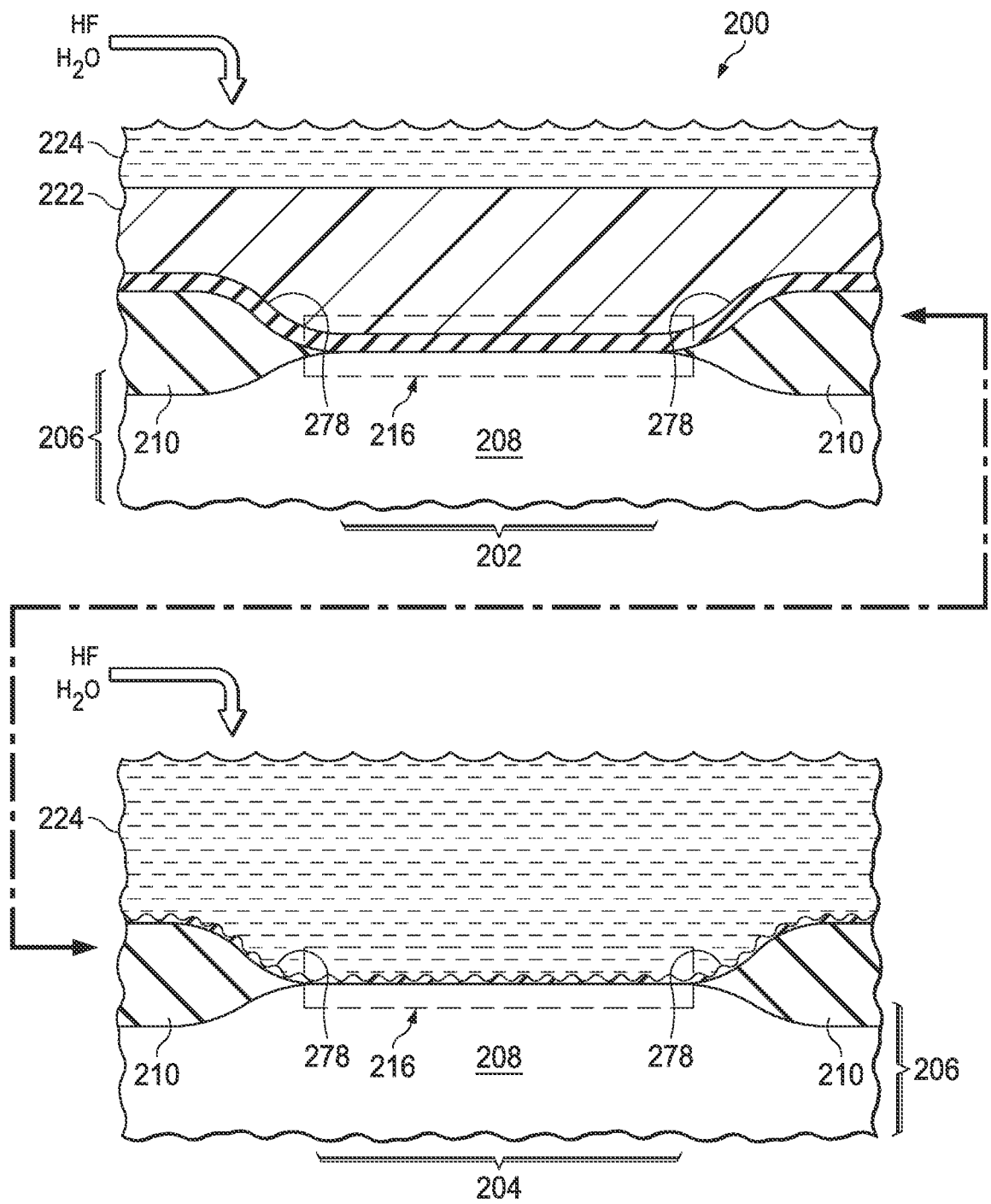

Referring to FIG. 2C, an inhibitor mask 222 is formed over the inhibitor layer 216, covering the area for the first dielectric layer 202 and exposing the inhibitor layer 216 in the area for the second dielectric layer 204. The inhibitor mask 222 may have the composition disclosed in reference to the inhibitor mask 122 of FIG. 1D.

The inhibitor layer 216 is removed where exposed by the inhibitor mask 222. The inhibitor layer 216 may be removed by a wet etch process using a first aqueous etch solution 224 of dilute hydrofluoric acid in deionized water, labeled "HF" and "$H_2O$", respectively, in FIG. 2C. FIG. 2C depicts removal of the inhibitor layer 216 in the area for the second dielectric layer 204 at completion. The inhibitor layer 216 remains in place in the area for the first dielectric layer 202, protected from the second aqueous etch solution 224 by the inhibitor mask 222. The surface layer 278 of the field oxide 210 may also be removed by the first aqueous etch solution 224 where exposed by the inhibitor mask 222. FIG. 2C depicts removal of the inhibitor layer 216 in the area for the second dielectric layer 204 and the surface layer 278 partway to completion.

Figure 2D:
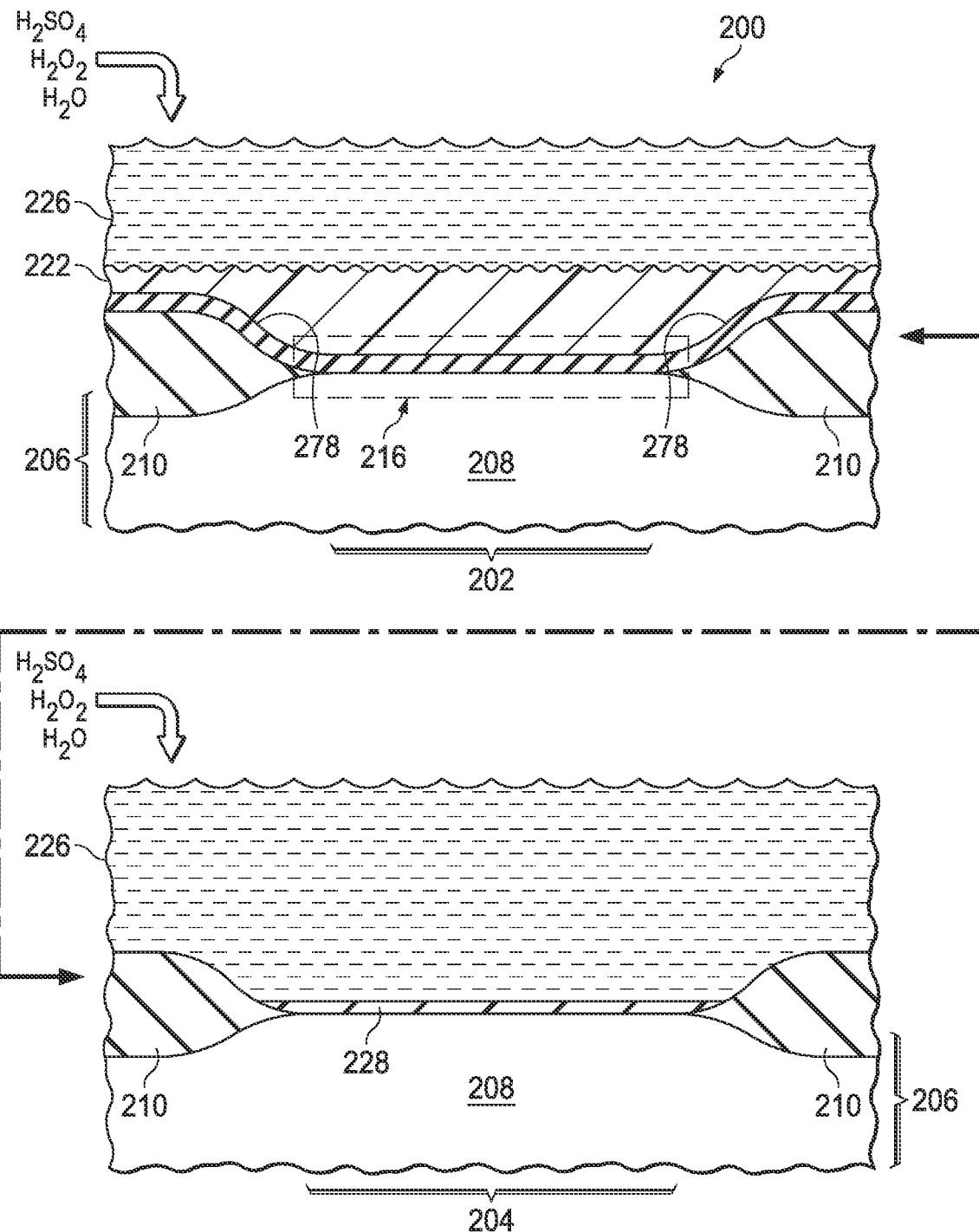

Referring to FIG. 2D, the inhibitor mask 222 is removed by a wet etch process, to avoid damage to the semiconductor material 208 in the area for the second dielectric layer 204. The inhibitor mask 222 may be removed by a first wet clean process using a first aqueous cleanup solution 226 which includes sulfuric acid, hydrogen peroxide, and deionized water, labeled "$H_2SO_4$", "$H_2O_2$", and "$H_2O$", respectively, in FIG. 2D. The first wet clean process may form a chemical oxide layer 228 on the semiconductor material 208 in the area for the second dielectric layer 204. FIG. 2D depicts removal of the inhibitor mask 222 partway to completion.

Figure 2E:
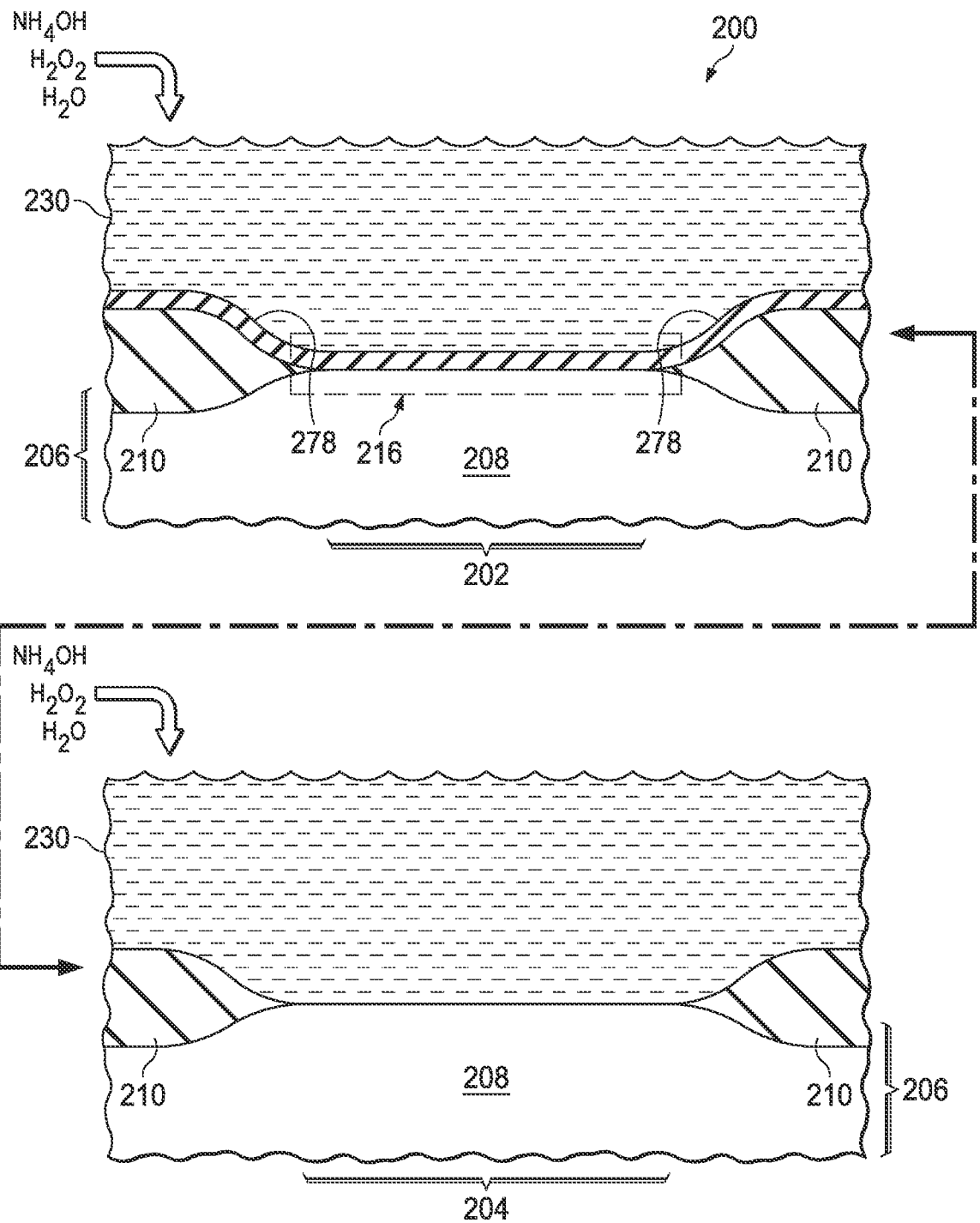
Figure 2F:
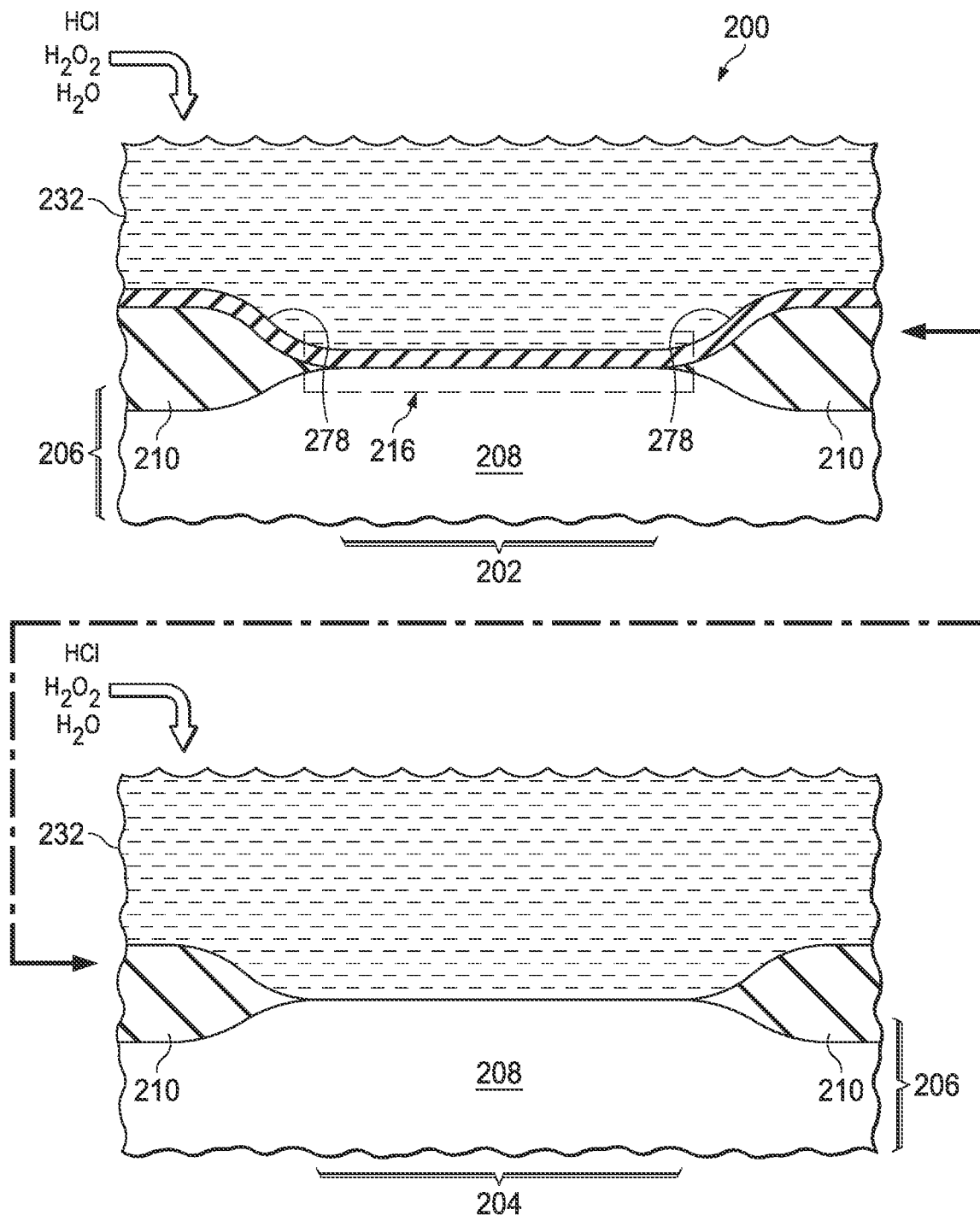
Figure 2G:
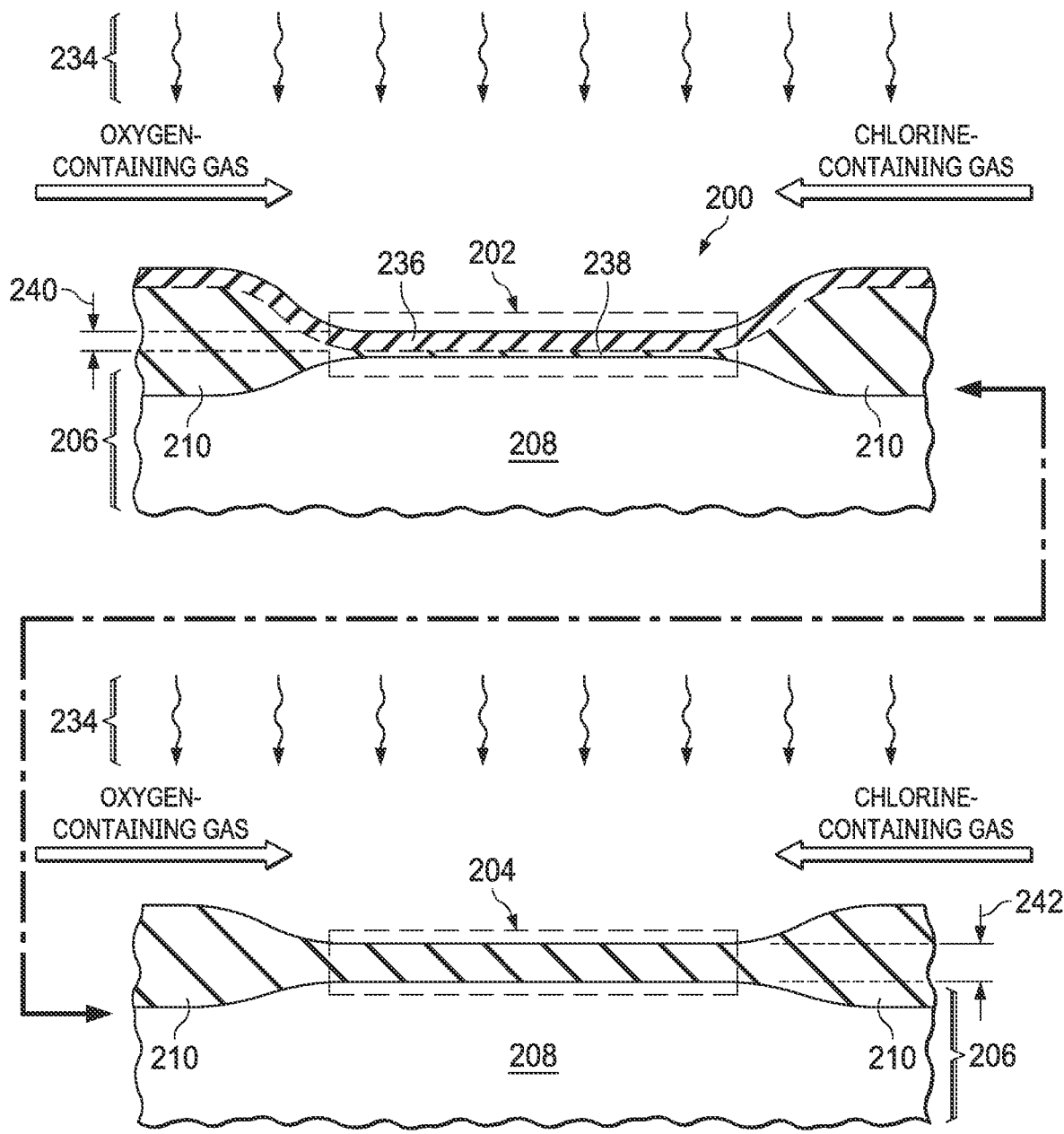

Referring to FIG. 2E, the chemical oxide layer 228 of FIG. 2D is removed to provide a clean surface on the semiconductor material 208 for formation of the second dielectric layer 204, shown in FIG. 2G. The chemical oxide layer 228 may be removed by a second wet clean process using a second aqueous cleanup solution 230 which includes ammonium hydroxide, hydrogen peroxide, and deionized water, labeled "$NH_4OH$", "$H_2O_2$", and "$H_2O$", respectively, in FIG. 2E, as disclosed in reference to FIG. 1G.

Referring to FIG. 2F, the semiconductor device 200 is cleaned by a third wet clean process using a third aqueous cleanup solution 232 which includes hydrochloric acid, hydrogen peroxide, and deionized water, labeled "HCl", "$H_2O_2$", and "$H_2O$", respectively, in FIG. 2F. The third aqueous cleanup solution 232 may advantageously remove metal contaminants from the surface of the semiconductor device 200, as well as any thin oxide layer formed by the second aqueous cleanup solution 230 of FIG. 2E.

Referring to FIG. 2G, a thermal oxidation process is performed in which the substrate 206 is heated to 800° C. to 1000° C. by a second heating process 234 while an oxygen-containing gas, labeled "OXYGEN-CONTAINING GAS," and a chlorine-containing gas, labeled "CHLORINE-CONTAINING GAS" in FIG. 2G, are flowed into an ambient contacting the inhibitor layer 216 of FIG. 2F and contacting the semiconductor material 208 in the area for the second dielectric layer 204. Optionally, a carrier gas, not shown in FIG. 2G, may be flowed into the ambient to dilute the oxygen-containing gas, as disclosed in reference to FIG. 1I. A mass flow rate of chlorine may be 2 percent to 8 percent of the total gas flow into the ambient.

The thermal oxidation process oxidizes the inhibitor layer 216 to form an oxidized inhibitor layer 236 and form an oxidized semiconductor material layer 238 between the oxidized inhibitor layer 236 and the semiconductor material 208, to form the first dielectric layer 202. The thermal oxidation process concurrently forms the second dielectric layer 204 by oxidizing silicon in the semiconductor material 208. The first dielectric layer 202 and the second dielectric layer 204 have compositions as disclosed in reference to the first dielectric layer 102 and the second dielectric layer 104 of FIG. 1I, respectively. The thermal oxidation process may also oxidize the surface layer 278 of FIG. 2F of the field oxide 210, converting the surface layer 278 back to silicon dioxide, and providing part of the field oxide 210.

The first dielectric layer 202 has a first thickness 240 and the second dielectric layer 204 has a second thickness 242. The first thickness 240 and the second thickness 242 may have the ranges and relationship disclosed in reference to the first thickness 140 and the second thickness 142 of FIG. 1I, respectively. The second dielectric layer 204 extends further into the semiconductor material 208 than the first dielectric layer 202 by a depth difference that is greater than 30 percent of a difference between the second thickness 242 and the first thickness 240, as explained in reference to FIG. 1I. In this example, the depth difference may be estimated using a bottom of the field oxide 210 as a reference plane, and taking a difference between bottoms of the first dielectric layer 202 and the second dielectric layer 204 with respect to the bottoms of the adjacent field oxide 210. Forming the first dielectric layer 202 and the second dielectric layer 204 using the inhibitor layer 216 may accrue the advantages disclosed in reference to the semiconductor device 100 of FIG. 1A through FIG. 1L.

Figure 2H:
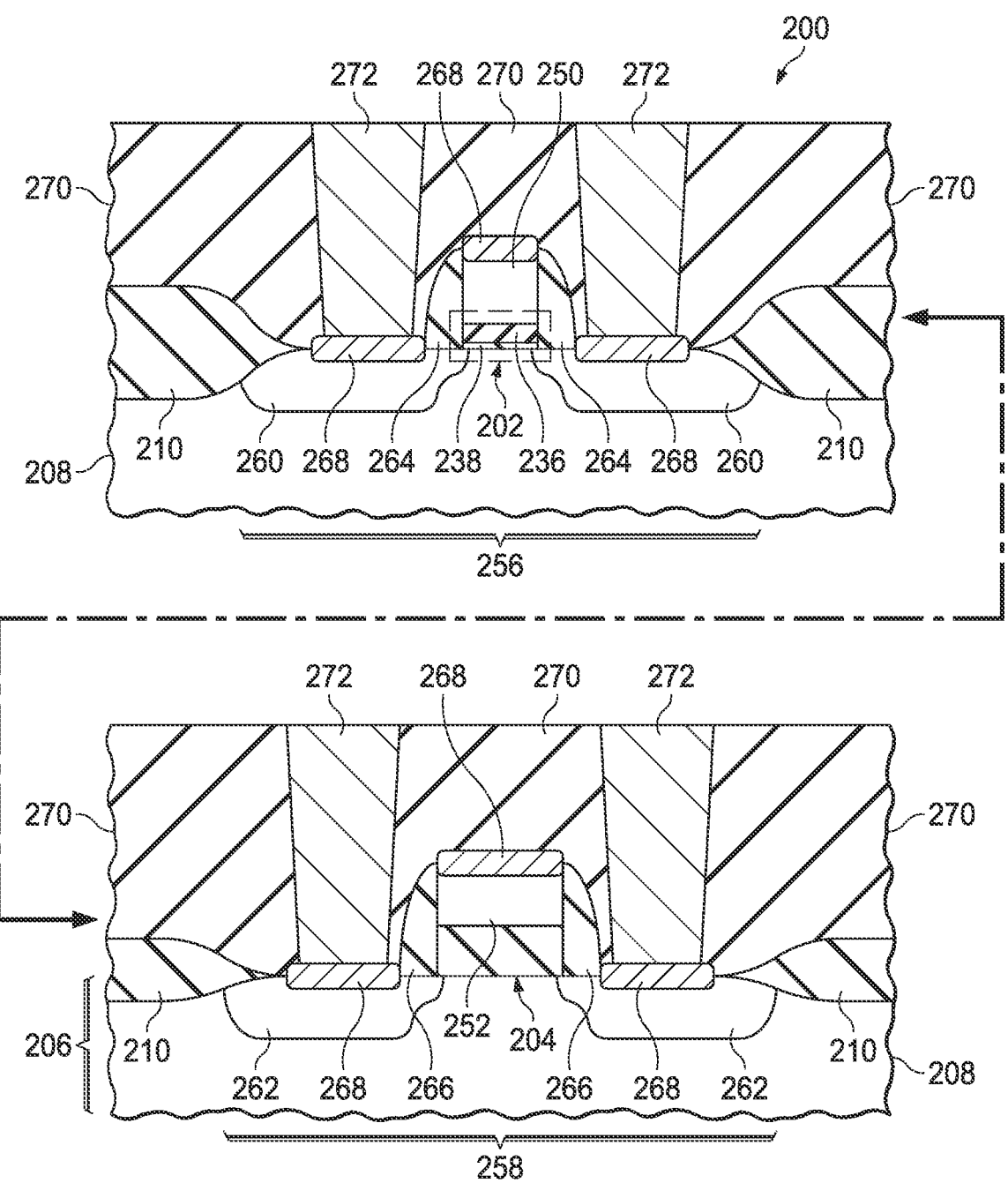

Referring to FIG. 2H, formation of the semiconductor device 200 is continued with formation of a first MOS transistor 256 and a second MOS transistor 258. The first MOS transistor 256 includes the first dielectric layer 202, and has a first gate 250 formed on the first dielectric layer 202. The first dielectric layer 202 provides a first gate dielectric layer 202 for the first MOS transistor 256, and the second dielectric layer 204 provides a second gate dielectric layer 204 for the second MOS transistor 258. First source/drain regions 260 are formed in the semiconductor material 208 adjacent to the first gate 250. First gate sidewall spacers 264 are formed on lateral surfaces of the first gate 250.

The second MOS transistor 258 includes the second dielectric layer 204, and has a second gate 252 formed on the second dielectric layer 204. Second source/drain regions 262 are formed in the semiconductor material 208 adjacent to the second gate 252. Second gate sidewall spacers 266 are formed on lateral surfaces of the second gate 252.

Metal silicide 268 may be formed on the first source/drain regions 260 adjacent to the first gate sidewall spacers 264, on the second source/drain regions 262 adjacent to the second gate sidewall spacers 266, on the first gate 250, and on the second gate 252. A PMD layer 270 may be formed over the first MOS transistor 256 and the second MOS transistor 258. Contacts 272 may be formed through the PMD layer 270 to make electrical connections to the first MOS transistor 256 and the second MOS transistor 258. The first dielectric layer 202 and the second dielectric layer 204, formed as disclosed in this example, may provide the advantages disclosed in reference to the first MOS transistor 156, the second MOS transistor 158, and the semiconductor device 100 of FIG. 1L.

Figure 3A:
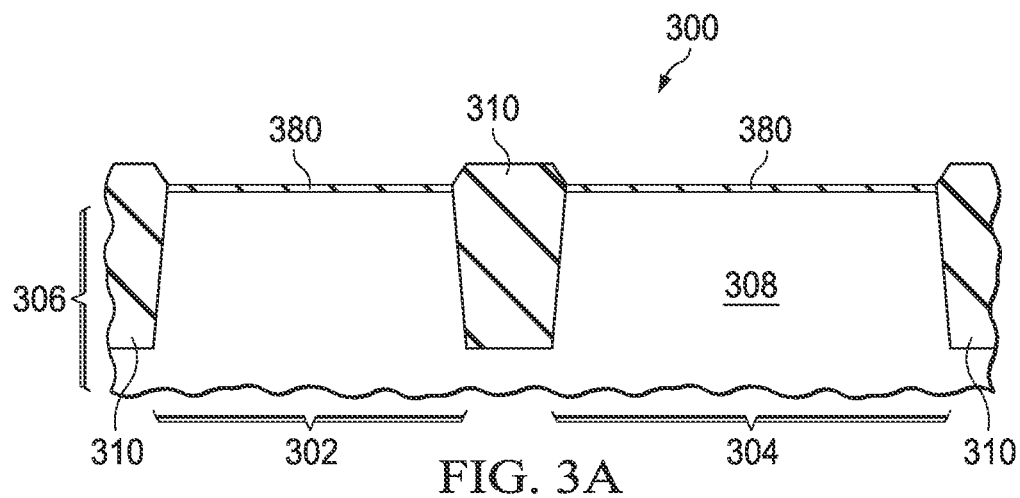
FIG. 3A through FIG. 3F are cross sections of a semiconductor device including a first dielectric layer and a second dielectric layer, depicted in stages of a further example method of formation.

FIG. 3A through FIG. 3F are cross sections of a semiconductor device 300 including a first dielectric layer 302 and a second dielectric layer 304, depicted in stages of a further example method of formation. Referring to FIG. 3A, the semiconductor device 300 is formed on a substrate 306 which includes a semiconductor material 308. The substrate 306 may be implemented as any of the examples disclosed in reference to the substrate 306 of FIG. 1A. The semiconductor material 308 may include silicon. Field oxide 310 may be formed in the substrate 306 which laterally separates an area for the first dielectric layer 302 from an area for the second dielectric layer 304.

In this example, the semiconductor device 300 may include a native oxide layer 380 on the semiconductor material 308 in the area for the first dielectric layer 302 and the area for the second dielectric layer 304. In one version of this example, the native oxide layer 380 may include primarily silicon dioxide, with some other elements such as dopant atoms of phosphorus or boron. In another version, the native oxide layer 380 may consist essentially of silicon dioxide. The native oxide layer 380 may have a thickness of 0.4 nanometers to 2 nanometers, by way of example. The thickness of the native oxide layer 380 may depend on a thermal profile of the substrate 306 while exposed to an oxidizing ambient, such as air. The substrate 306 may be heated, for example at 100° C. in air, to increase the thickness of the native oxide layer 380.

Figure 3B:
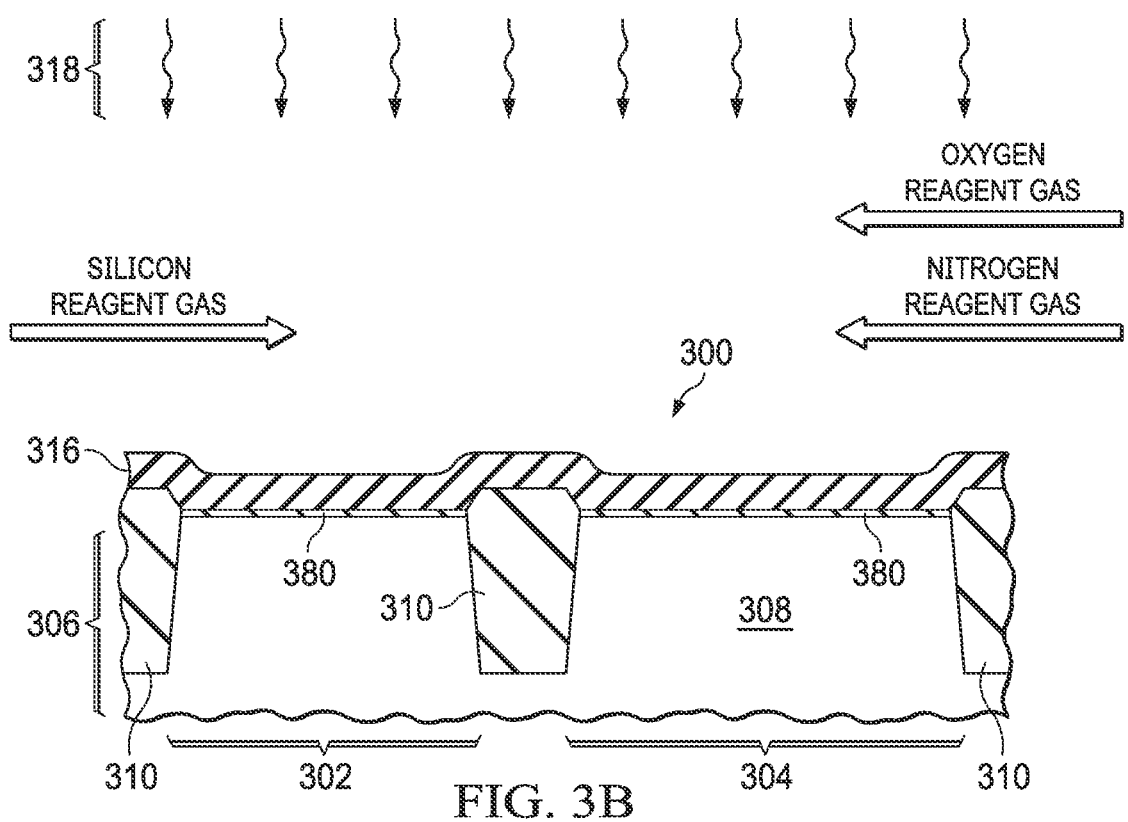

Referring to FIG. 3B, an inhibitor layer 316 is formed on the native oxide layer 380 in the areas for the first dielectric layer 302 and the second dielectric layer 304. In this example, the substrate 306 is heated by a first heating process 318 to 400° C. to 650° C., which may be implemented as a heated wafer chuck, for example. The inhibitor layer 316 may be formed by an ALD process in which one or more silicon-containing reagent gases, labeled "SILICON REAGENT GAS" in FIG. 3B, and one or more nitrogen-containing reagent gases, labeled "NITROGEN REAGENT GAS" in FIG. 3B, and optionally one or more oxygen-containing reagent gases, labeled "OXYGEN REAGENT GAS" in FIG. 3B, are alternately and sequentially flowed into an ambient contacting the native oxide layer 380. The silicon-containing reagent gases may be implemented as one or more chlorosilanes, chlorodisilanes, organosilanes or amonoorganosilanes, such as tris(dimethylamnio)silane or bis(diethylamino)silane. The nitrogen-containing reagent gases may be implemented as ammonia gas or hydrazine, for example. The oxygen-containing reagent gases may be implemented as plasma activated oxygen or ozone. The inhibitor layer 316 has the properties and thickness range disclosed in reference to the inhibitor layer 116 of FIG. 1C. Forming the inhibitor layer 316 using an ALD process may provide desired control over composition and thickness compared to other methods.

Figure 3C:
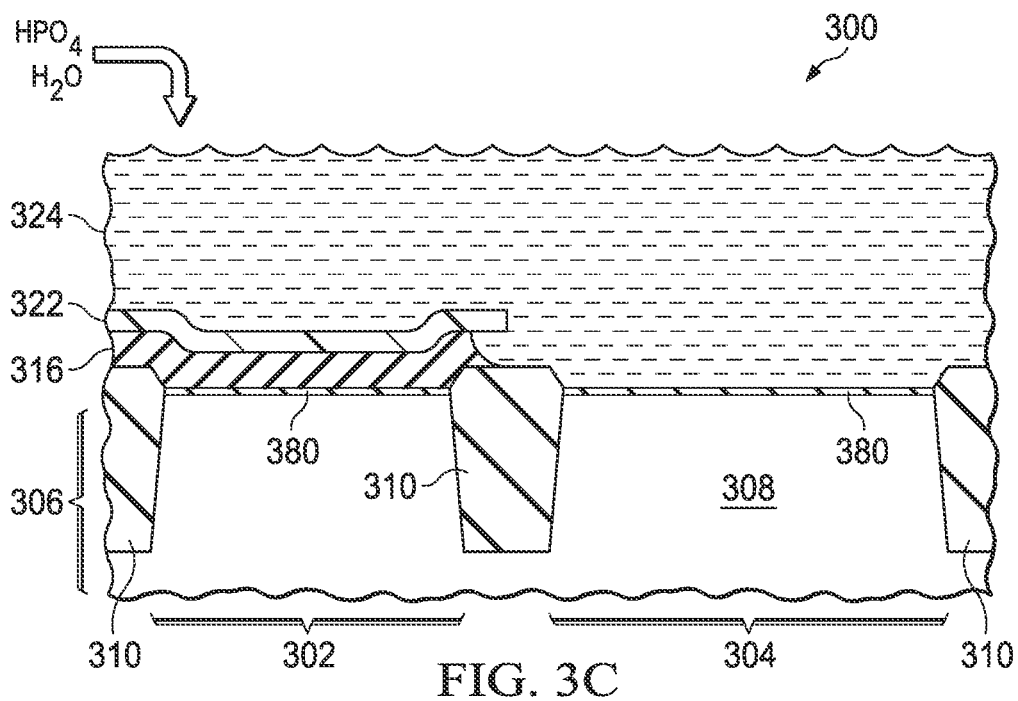

Referring to FIG. 3C, an inhibitor mask 322 is formed over the inhibitor layer 316, covering the area for the first dielectric layer 302 and exposing the inhibitor layer 316 in the area for the second dielectric layer 304. In this example, the inhibitor mask 322 may include hard mask material, such as silicon dioxide, formed by a PECVD process or an LPCVD process.

The inhibitor layer 316 is removed where exposed by the inhibitor mask 322. The inhibitor layer 316 may be removed by a wet etch process using a second aqueous etch solution 324 of phosphoric acid in deionized water, labeled "HPO$_4$" and "H$_2$O", respectively, in FIG. 3C. FIG. 3C depicts removal of the inhibitor layer 316 in the area for the second dielectric layer 304 at completion. The native oxide layer 380 remains in place in the area for the second dielectric layer 304 and protects the semiconductor material 308 from the second aqueous etch solution 324.

Figure 3D:
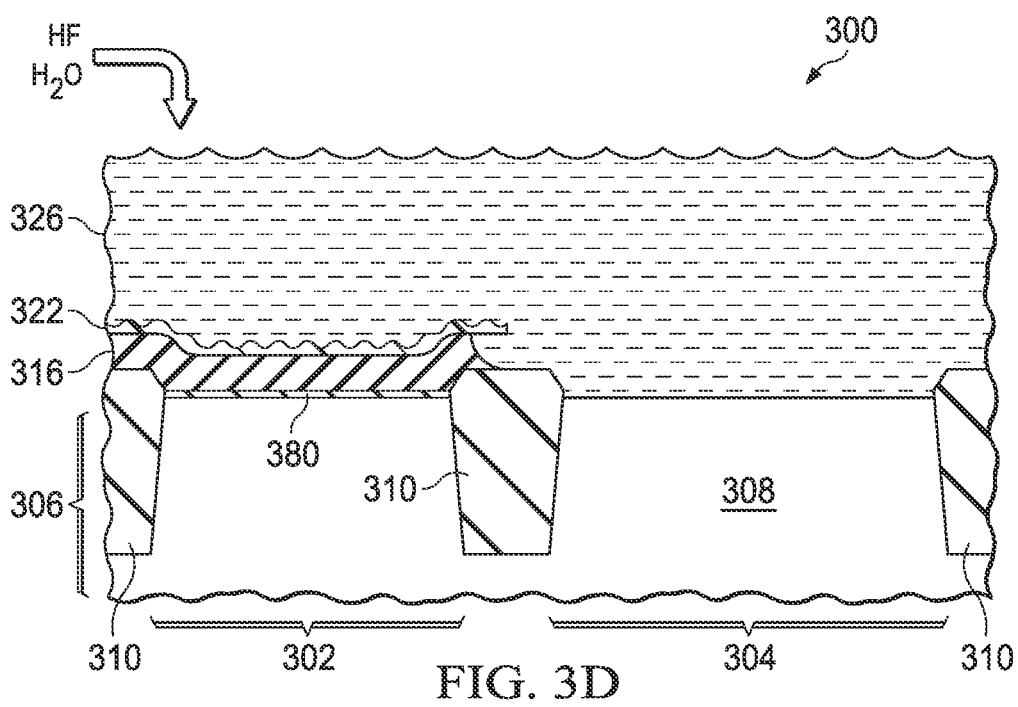

Referring to FIG. 3D, the inhibitor mask 322 is removed. The inhibitor mask 322 may be removed by a first wet clean process using a first aqueous cleanup solution 326 which includes hydrofluoric acid and deionized water, labeled "HF" and "H$_2$O", respectively, in FIG. 3D. In this example, the first wet clean process is continued for a sufficient time to remove the inhibitor mask 322, but is terminated in time to prevent degradation of the inhibitor layer 316. This condition may be attained implementing the first aqueous cleanup solution 326 as a 1 percent HF solution, and exposing the semiconductor device 300 to the first aqueous cleanup solution 326 for 20 seconds to 100 seconds, by way of example. FIG. 3D depicts removal of the inhibitor mask 322 partway to completion. The first wet clean process may remove the native oxide layer 380 from the semiconductor material 308 in the area for the second dielectric layer 304, as indicated in FIG. 3D. Additional wet clean processes may be applied to the semiconductor device 300, for example as disclosed in reference to FIG. 1G and FIG. 1H, prior to forming the first dielectric layer 302 and the second dielectric layer 304. Another native oxide layer, not shown in FIG. 3F, may form on the semiconductor material 308 in the area for the second dielectric layer 304 after the additional wet clean processes are applied, prior to forming the second dielectric layer 304.

Figure 3E:
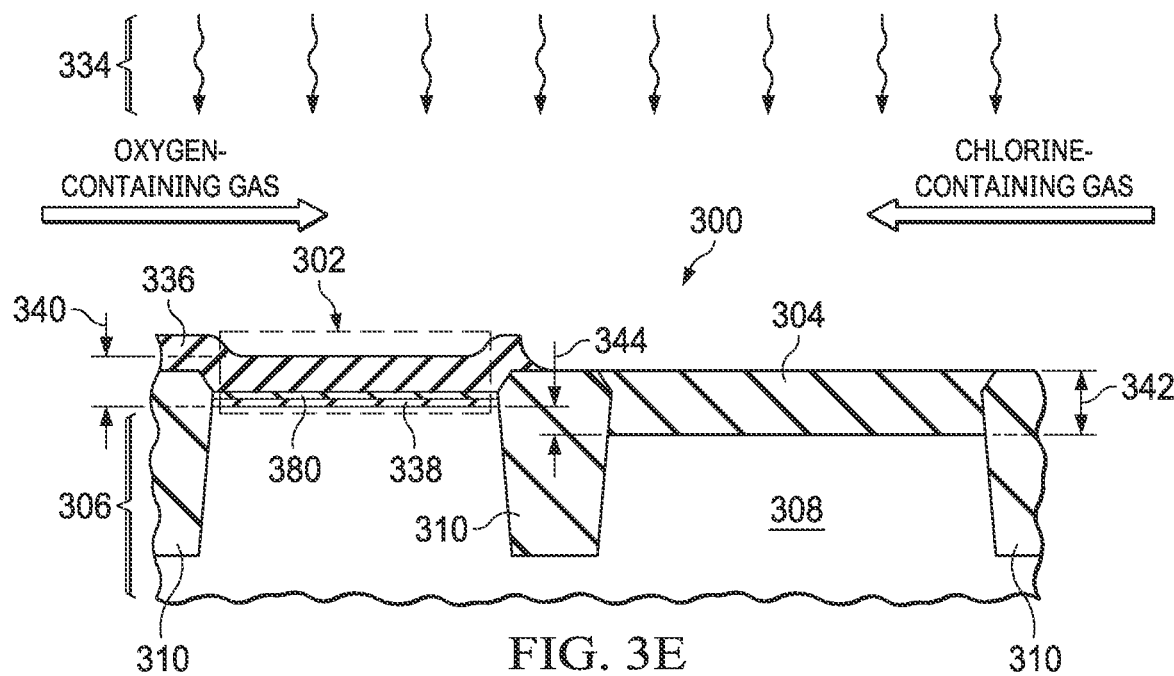

Referring to FIG. 3E, a thermal oxidation process is performed in which the substrate 306 is heated to 800° C. to 1000° C. by a second heating process 334. An oxygen-containing gas, labeled "OXYGEN-CONTAINING GAS," and a chlorine-containing gas, labeled "CHLORINE-CONTAINING GAS" in FIG. 3E, are flowed into an ambient contacting the inhibitor layer 316 of FIG. 3D and contacting the semiconductor material 308 in the area for the second dielectric layer 304. Optionally, a carrier gas, not shown in FIG. 3E, may be flowed into the ambient. A mass flow rate of chlorine may be 2 percent to 8 percent of the total gas flow into the ambient.

The thermal oxidation process oxidizes the inhibitor layer 316 to form an oxidized inhibitor layer 336 over the native oxide layer 380, and form an oxidized semiconductor material layer 338 between the native oxide layer 380 and the semiconductor material 308 in the area for the first dielectric layer 302. The native oxide layer 380 may be annealed by the second heating process 334, and an oxygen content of the native oxide layer 380 may be increased slightly by the thermal oxidation process. In this example, the oxidized inhibitor layer 336, the native oxide layer 380, and the oxidized semiconductor material layer 338 provide the first dielectric layer 302.

The thermal oxidation process concurrently forms the second dielectric layer 304 by oxidizing silicon in the semiconductor material 308 in the area for the second dielectric layer 304. The first dielectric layer 302 and the second dielectric layer 304 have compositions as disclosed in reference to the first dielectric layer 102 and the second dielectric layer 104 of FIG. 1I, respectively.

The first dielectric layer 302 has a first thickness 340 and the second dielectric layer 304 has a second thickness 342. The first thickness 340 and the second thickness 342 may have the ranges and relationship disclosed in reference to the first thickness 140 and the second thickness 142 of FIG. 1I, respectively. The second dielectric layer 304 extends further into the semiconductor material 308 than the first dielectric layer 302 by a depth difference 344 that is greater than 30 percent of a difference between the second thickness 342 and the first thickness 340. Forming the first dielectric layer 302 and the second dielectric layer 304 using the inhibitor layer 316 may accrue the advantages disclosed in reference to the semiconductor device 100 of FIG. 1A through FIG. 1L.

Figure 3F:
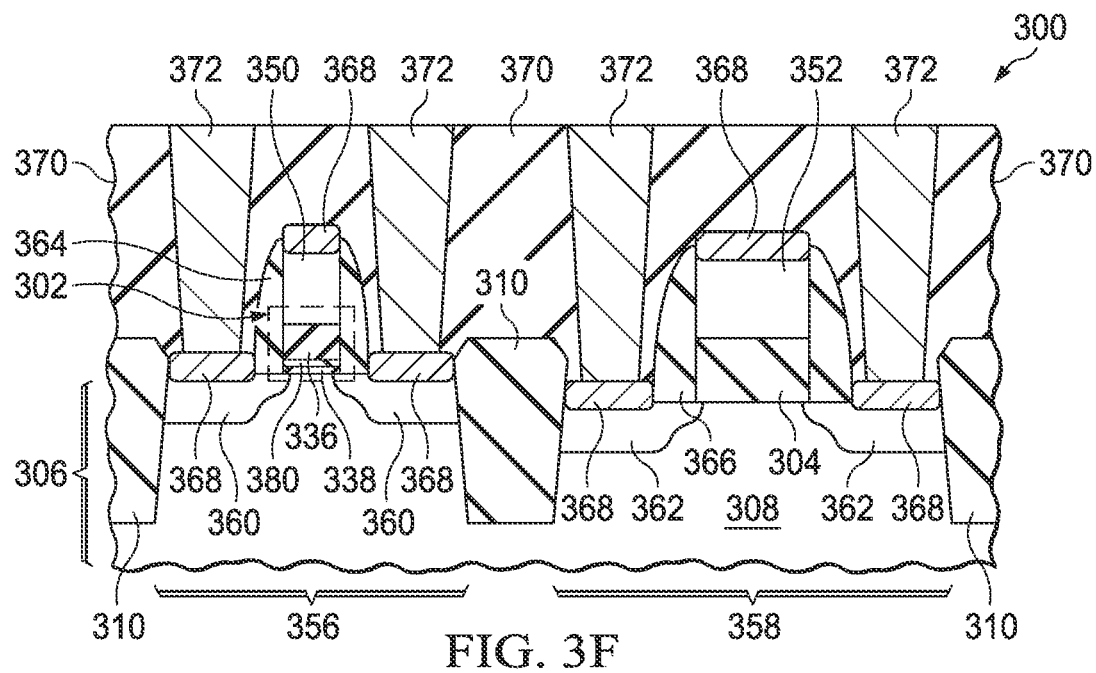

Referring to FIG. 3F, formation of the semiconductor device 300 is continued with formation of a first MOS transistor 356 which includes the first dielectric layer 302, and a second MOS transistor 358 which includes the second dielectric layer 304. The first dielectric layer 302 provides a first gate dielectric layer 302 for the first MOS transistor 356, and the second dielectric layer 304 provides a second gate dielectric layer 304 for the second MOS transistor 358. The first MOS transistor 356 has a first gate 350 formed on the first dielectric layer 302, and the second MOS transistor 358 has a second gate 352 formed on the second dielectric layer 304. The first MOS transistor 356 has first source/drain regions 360 formed in the semiconductor material 308 adjacent to the first gate 350, and the second MOS transistor 358 has second source/drain regions 362 formed in the semiconductor material 308 adjacent to the second gate 352. The first MOS transistor 356 has first gate sidewall spacers 364 formed on lateral surfaces of the first gate 350, and the second MOS transistor 358 has second gate sidewall spacers 366 formed on lateral surfaces of the second gate 352.

The semiconductor device 300 may have metal silicide 368 formed exposed semiconductor material, including the first source/drain regions 360, the second source/drain regions 362, the first gate (350, and the second gate 352. The semiconductor device 300 may have a PMD layer 370 formed over the substrate 306, with contacts 372 formed through the PMD layer 370. The first dielectric layer 302 and the second dielectric layer 304, formed as disclosed in this example, may provide the advantages disclosed in reference to the first MOS transistor 156, the second MOS transistor 158, and the semiconductor device 100 of FIG. 1L.

Various features of the examples disclosed herein may be combined in other implementations of example methods of forming semiconductor devices having first and second dielectric layers. For example, any of the first dielectric layers 102, 202, or 302 may incorporate a native oxide layer on the corresponding semiconductor material 108, 208, or 308. Any of the semiconductor devices 100, 200, or 300 may have field oxide 110, 210, or 310, respectively, formed by an STI process or by a LOCOS process. Any of the first dielectric layers 102, 202, or 302 may incorporate carbon or oxygen, in addition to silicon and nitrogen. The thermal oxidation processes used to form any of the first dielectric layers 102, 202, or 302 may be implemented with chlorine, or a carrier gas to dilute the oxygen. Any of the first gates 150, 250, or 350 may include polycrystalline silicon, or may include one or more sublayers of gate material such as titanium nitride.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
a substrate including a semiconductor material;
a first dielectric layer on the semiconductor material, the first dielectric layer including an oxidized inhibitor layer and an oxidized semiconductor material layer located between the oxidized inhibitor layer and the substrate, the first dielectric layer having a first thickness; and
a second dielectric layer on the semiconductor material, the second dielectric layer having a second thickness, wherein:
the second thickness is greater than the first thickness; and
the second dielectric layer extends further into the semiconductor material than the first dielectric layer.

2. The semiconductor device of claim 1, wherein the second thickness is at least 40 percent greater than the first thickness and no more than 5 times the first thickness.

3. The semiconductor device of claim 1, wherein the second dielectric layer extends further into the semiconductor material than the first dielectric layer by a depth difference that is greater than 30 percent of a difference between the second thickness and the first thickness.

4. The semiconductor device of claim 1, wherein the first dielectric layer includes at least 90 weight percent silicon dioxide, and the second dielectric layer includes at least 90 weight percent silicon dioxide.

5. The semiconductor device of claim 1, wherein the first dielectric layer provides a first gate dielectric layer for a first metal oxide semiconductor (MOS) transistor and the second dielectric layer provides a second gate dielectric layer for a second MOS transistor.

6. The semiconductor device of claim 1, wherein the second thickness is equal to or less than five times the first thickness.

7. The semiconductor device of claim 1, wherein at least one of the first dielectric layer and the second dielectric layer comprises at least one of fluorine and boron.

8. The semiconductor device of claim 1, wherein the first thickness is between 2.4 nanometers to 25 nanometers.

9. The semiconductor device of claim 1, wherein the second thickness is between 10 nanometers to 100 nanometers.

10. The semiconductor device of claim 1, wherein the first dielectric layer includes less than 1 weight percent nitrogen.

11. The semiconductor device of claim 1, wherein the second dielectric layer includes silicon dioxide with less than 1 weight percent nitrogen.

12. The semiconductor device of claim 1, wherein the first dielectric layer is thinner than the second dielectric layer.

13. The semiconductor device of claim 1, wherein the second dielectric layer extends further into the substrate than the first dielectric layer.

14. The semiconductor device of claim 1, wherein the first dielectric layer includes silicon and nitrogen.

15. The semiconductor device of claim 14, wherein the first dielectric layer further includes oxygen.

16. The semiconductor device of claim 14, wherein the first dielectric layer further includes carbon.

17. A structure, comprising:
a semiconductor substrate; and
a field oxide layer on the semiconductor substrate, the field oxide layer comprising a first region next to a first transistor with a first gate dielectric layer and a second region next to a second transistor with a second gate dielectric layer, wherein:
the first gate dielectric layer includes a silicon dioxide layer on the semiconductor substrate and an oxidized inhibitor layer on the silicon dioxide layer, a bottom surface of the silicon dioxide layer being away from a bottom surface of the first region of the field oxide layer by a first distance; and
a bottom surface of the second gate dielectric layer is away from a bottom surface of the second region of the field oxide layer by a second distance less than the first distance.

18. The structure of claim 17, wherein the field oxide layer comprises silicon dioxide with less than 1 weight percent nitrogen.

19. The structure of claim 17, wherein the field oxide layer includes at least 90 weight percent silicon dioxide.

20. The structure of claim 17, wherein the first gate dielectric layer is thinner than the second gate dielectric layer.

21. The structure of claim 17, wherein the second gate dielectric layer extends further into the semiconductor substrate than the first gate dielectric layer.

22. The structure of claim 17, wherein the first gate dielectric layer includes less than 1 weight percent nitrogen.

23. The structure of claim 17, wherein the first gate dielectric layer includes silicon and nitrogen.

24. The structure of claim 23, wherein the first gate dielectric layer further includes oxygen.

25. The structure of claim 23, wherein the first gate dielectric layer further includes carbon.

26. A semiconductor device, comprising:
a first transistor with a first gate dielectric layer and a first gate on the first gate dielectric layer, the first gate dielectric layer comprises an oxidized semiconductor material layer, and an oxidized inhibitor layer, the first gate dielectric layer having a first thickness; and
a second transistor having a second gate dielectric layer and a second gate on the second gate dielectric layer, the second gate dielectric having a second thickness;
wherein a top surface of the first gate dielectric layer is level with a top surface of the second gate electric, and the second gate dielectric layer extends further into a semiconductor material than the first gate dielectric layer.

27. The semiconductor device of claim 26, wherein the second thickness is equal to or less than five times the first thickness.

28. The semiconductor device of claim 26, wherein the first gate dielectric layer and the second gate dielectric layer each comprises silicon dioxide with less than 1 weight percent nitrogen.

29. The semiconductor device of claim 26, wherein the second transistor has a higher operating voltage than the first transistor.

* * * * *